(12) United States Patent
Fan

(10) Patent No.: US 10,989,405 B2
(45) Date of Patent: Apr. 27, 2021

(54) LUMINOUS FAN AND LIGHT GUIDE MEMBER

(71) Applicant: COOLER MASTER TECHNOLOGY INC., New Taipei (TW)

(72) Inventor: Shao-Dong Fan, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 231 days.

(21) Appl. No.: 16/015,647

(22) Filed: Jun. 22, 2018

(65) Prior Publication Data

US 2019/0249862 A1 Aug. 15, 2019

(30) Foreign Application Priority Data

Feb. 14, 2018 (CN) .......................... 201810151961.0
Apr. 3, 2018 (CN) .......................... 201810290160.2

(51) Int. Cl.
| | |
|---|---|
| *F21V 33/00* | (2006.01) |
| *F21V 7/00* | (2006.01) |
| *F21V 17/12* | (2006.01) |
| *H05K 7/20* | (2006.01) |
| *F04D 29/00* | (2006.01) |
| *G06F 1/20* | (2006.01) |

(Continued)

(52) U.S. Cl.
CPC ........ *F21V 33/0096* (2013.01); *F04D 19/002* (2013.01); *F04D 25/066* (2013.01); *F04D 29/005* (2013.01); *F21V 7/0091* (2013.01); *F21V 17/12* (2013.01); *G06F 1/20* (2013.01); *H05K 7/20172* (2013.01); *F21Y 2115/10* (2016.08); *G06F 2200/201* (2013.01)

(58) Field of Classification Search
CPC .... F04D 25/08; F04D 25/0613; F04D 29/005; F04D 29/526; F04D 29/00; H05K 7/20172; F21V 33/0052; F21V 33/0096; F21V 23/005; G06F 1/20; F21Y 2107/10; F21Y 2103/10; F21Y 2115/10
USPC .......................................................... 362/294
See application file for complete search history.

(56) References Cited

U.S. PATENT DOCUMENTS 9,777,918 B1 * 10/2017 Wen ...................... G02B 6/0001
2010/0040457 A1 * 2/2010 Tsen ...................... F04D 29/526
　　　　　　　　　　　　　　　　　　　　　415/121.3

(Continued)

FOREIGN PATENT DOCUMENTS

CN        206397762    *  8/1917   ............. F04D 25/08
CN        203594996 U  *  5/2014   ............. B01D 46/00

(Continued)

*Primary Examiner* — Rajarshi Chakraborty
*Assistant Examiner* — Fatima N Farokhrooz
(74) *Attorney, Agent, or Firm* — Maschoff Brennan

(57) ABSTRACT

The disclosure provides a luminous fan including a main body, a light guide member and at least one light source. The main body includes a fan frame and a propeller, and the propeller is rotatably mounted on the fan frame. The light guide member includes an outer light guide ring and an inner light guide ring, the outer light guide ring and the inner light guide ring are mounted on the fan frame, the inner light guide ring has an air channel, the propeller is located in the air channel, and the outer light guide ring surrounds the inner light guide ring and is exposed from the luminous fan. The at least one light source is disposed between the outer light guide ring and the inner light guide ring.

11 Claims, 19 Drawing Sheets

(51) Int. Cl.
   *F04D 19/00*    (2006.01)
   *F04D 25/06*    (2006.01)
   *F21Y 115/10*   (2016.01)

(56) References Cited

U.S. PATENT DOCUMENTS

2014/0254177 A1* 9/2014 Danesh .................. F21S 8/026
                                                    362/363
2016/0369809 A1* 12/2016 Richter ................ F04D 27/004

FOREIGN PATENT DOCUMENTS

CN    205654567 U  * 10/2016  .......... F21V 33/0096
TW    548771       *  9/2017  .......... F21V 33/0096

* cited by examiner

LUMINOUS FAN AND LIGHT GUIDE MEMBER

CROSS-REFERENCE TO RELATED APPLICATIONS

This non-provisional application claims priority under 35 U.S.C. § 119(a) on Patent Application No(s). 201810151961.0 filed in China on Feb. 14, 2018, and Patent Application No(s). 201810290160.2 filed in China on Apr. 3, 2018, the entire contents of which are hereby incorporated by reference.

TECHNICAL FIELD

The disclosure relates to a luminous device and light guide member, more particularly to a luminous fan and a light guide member thereof.

BACKGROUND

With the popularity of personal computer and the development of information technology, the personal computer is not only used for work, but for creative leisure, educational purposes, entertainment, communication, or personal information management.

At present, there are various transparent computer casings in the market, by putting colored light sources, such as colored LEDs or lamps, into such casing could give the computer a colorful visual effect.

Usually, the colored light sources are mounted on the frame of the computer fan and being toward the propeller of the fan in order to turn the fan into a luminous fan.

However, the frame contains fasteners for assembling its upper and lower frame, and the fasteners are opaque and will block the light from the light sources. As a result, some of light is missing, so the desired visual effect is effected and the fan fails to create a complete ring-shaped illumination.

SUMMARY

Accordingly, the present disclosure provides a luminous fan and a light guide member thereof in order to create a complete ring-shaped illumination at the interior or exterior of the luminous fan.

One embodiment of the disclosure provides a luminous fan including a main body, a light guide member and at least one light source. The main body includes a fan frame and a propeller, and the propeller is rotatably mounted on the fan frame. The light guide member includes an outer light guide ring and an inner light guide ring, the outer light guide ring and the inner light guide ring are mounted on the fan frame, the inner light guide ring has an air channel, the propeller is located in the air channel, and the outer light guide ring surrounds the inner light guide ring and is exposed from the luminous fan. The at least one light source is disposed between the outer light guide ring and the inner light guide ring.

One embodiment of the disclosure provides a light guide member adapted to be mounted on a fan frame having a plurality of first mounting parts. The light guide member includes at least one inner light guide ring and an outer light guide ring. The at least one inner light guide ring has an air channel configured to accommodate a propeller, the at least one inner light guide ring has a plurality of second mounting parts located at the exterior of the air channel, and the plurality of second mounting parts is configured to be connected to the plurality of first mounting parts. The outer light guide ring is mounted on the at least one inner light guide ring and surrounds the plurality of second mounting parts of the inner light guide ring.

One embodiment of the disclosure provides a luminous fan including a main body, a light guide member and a light source. The main body includes a fan frame and a propeller, the propeller is rotatably mounted on the fan frame, and the fan frame has a first mounting part. The light guide member has a second mounting part, a first ring-shaped illuminating surface and a second ring-shaped illuminating surface, the second mounting part of the light guide member is connected to the first mounting part of the main body, the first ring-shaped illuminating surface surrounds the propeller and faces away from the propeller, the second ring-shaped illuminating surface is opposite to the first ring-shaped illuminating surface, and the first mounting part and the second mounting part are located between the first ring-shaped illuminating surface and the second ring-shaped illuminating surface. The light source is disposed on the light guide member.

One embodiment of the disclosure provides a light guide member configured to surround a propeller, the light guide member has a second mounting part and a first ring-shaped illuminating surface, the first ring-shaped illuminating surface surrounds the propeller, and a distance between the first ring-shaped illuminating surface and a rotation axis of the propeller is larger than a distance between the second mounting part and the rotation axis.

One embodiment of the disclosure provides a luminous fan including a main body, light guide member and at least one light source. The main body includes a fan frame and a propeller, and the propeller is rotatably mounted on the fan frame. The light guide member, has a first ring-shaped illuminating surface, the first ring-shaped illuminating surface surrounds the propeller and faces away from the propeller, and the main body is located out of a range of emitting light from the first ring-shaped illuminating surface. The at least one light source is disposed on the light guide member.

One embodiment of the disclosure provides a luminous fan including a main body, a light guide member and a light source. The main body includes a fan frame and a propeller, the fan frame has at least one first mounting part, and the propeller is rotatably mounted on the fan frame. The light guide member has at least one second mounting part and a first ring-shaped illuminating surface, the at least one second mounting part is connected to the plurality of first mounting parts, the first ring-shaped illuminating surface surrounds and faces away from the propeller, and the first ring-shaped illuminating surface is not blocked by the at least one second mounting part and the plurality of first mounting parts. The light source is disposed on the light guide member.

One embodiment of the disclosure provides a luminous fan including a main body, a light guide member and at least one light source. The main body includes a fan frame and a plurality of propellers, and the plurality of propellers are rotatably mounted on the fan frame. The light guide member includes an outer light guide ring and a plurality of inner light guide rings, the plurality of inner light guide rings are mounted on the fan frame, the plurality of inner light guide rings each have an air channel, the plurality of propellers are respectively located in the air channels, the outer light guide ring is mounted on the plurality of inner light guide rings and surrounds the plurality of inner light guide rings, and the outer light guide ring is exposed from the luminous fan. The at least one light source is disposed between the outer light guide ring and the inner light guide ring.

One embodiment of the disclosure provides a luminous fan including a main body and a light guide member. The main body includes a fan frame and a propeller, the fan frame includes a first carrier board and a second carrier board, the first carrier board and the second carrier board each having a ring-shaped stopper and a first mounting part, the first mounting part is located on the ring-shaped stopper, and the propeller is rotatably mounted on the first carrier board of the fan frame. The light guide member includes an outer light guide ring and an inner light guide ring, two opposite sides of the inner light guide ring are respectively in contact with the first carrier board and the second carrier board, the ring-shaped stopper surrounds the inner light guide ring, the outer light guide ring has two second mounting parts respectively mounted on the first mounting parts of the first carrier board and the second carrier board, and the outer light guide ring surrounds the inner light guide ring and exposed from the luminous fan.

According to the luminous fan and the light guide member thereof as discussed in above, regardless of whether the outer light guide ring is made of one piece or consisted of a multiple of components, the outer light guide ring surrounds the fan frame and the mounting part of the light guide member (that is, the distance between the first ring-shaped illuminating surface and the rotation axis is larger than the distance between a side of the first mounting part away from the rotation axis and the rotation axis), such that the ring-shaped illuminating surface of the outer light guide ring is not blocked by the mounting part, ensuring to create a complete annulus of light (or a ring-shaped illumination) and an annular halo at the exterior of the luminous fan and thereby improving the visual effect of the luminous fan.

Also, as long as the first ring-shaped illuminating surface is not blocked by the mounting part, the luminous fan still can create the ring-shaped illumination even when the distance between the first ring-shaped illuminating surface and the rotation axis is smaller than the distance between a side of the first mounting part away from the rotation axis and the rotation axis.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
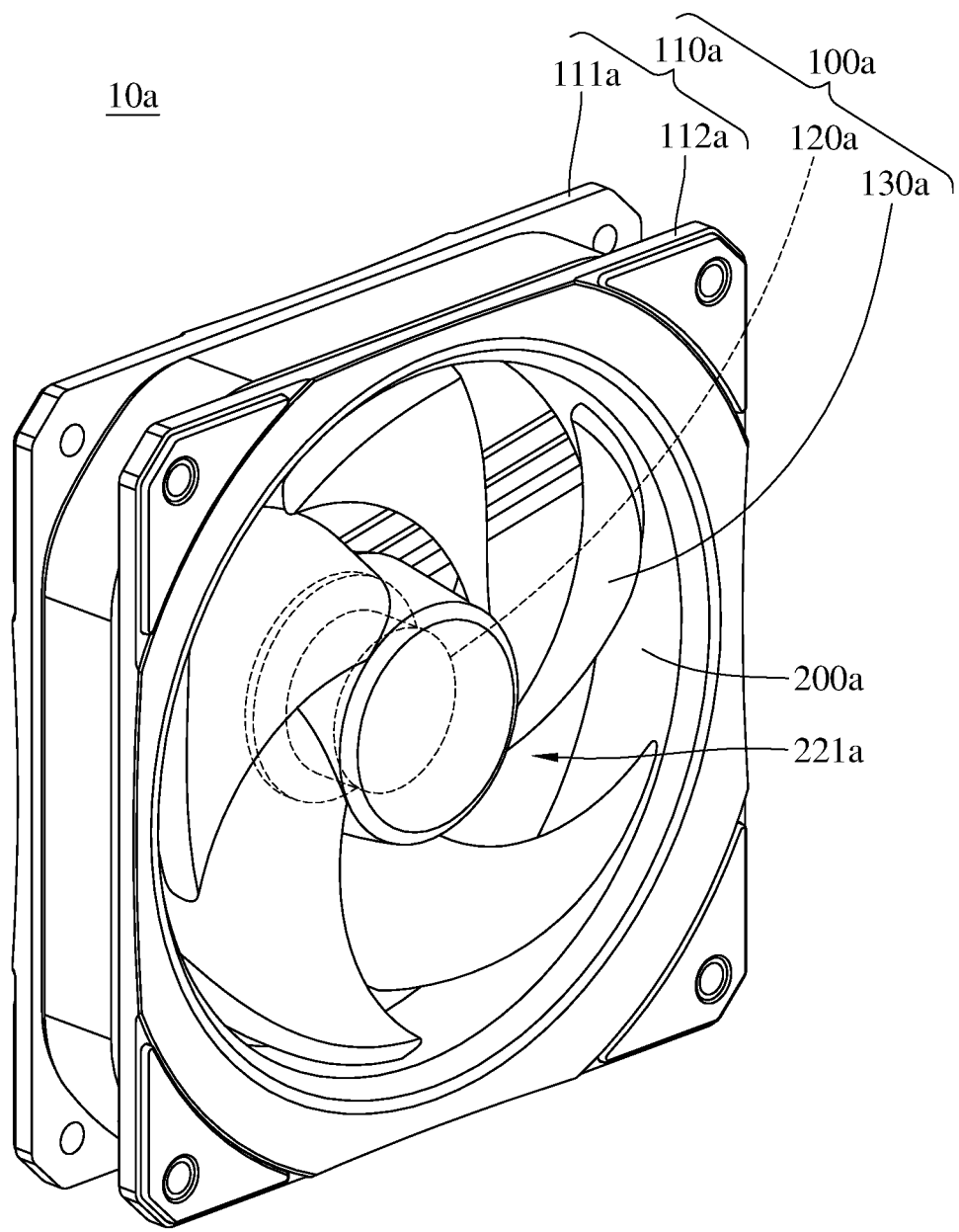
FIG. 1 is a perspective view of a luminous fan according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

Figure 2:
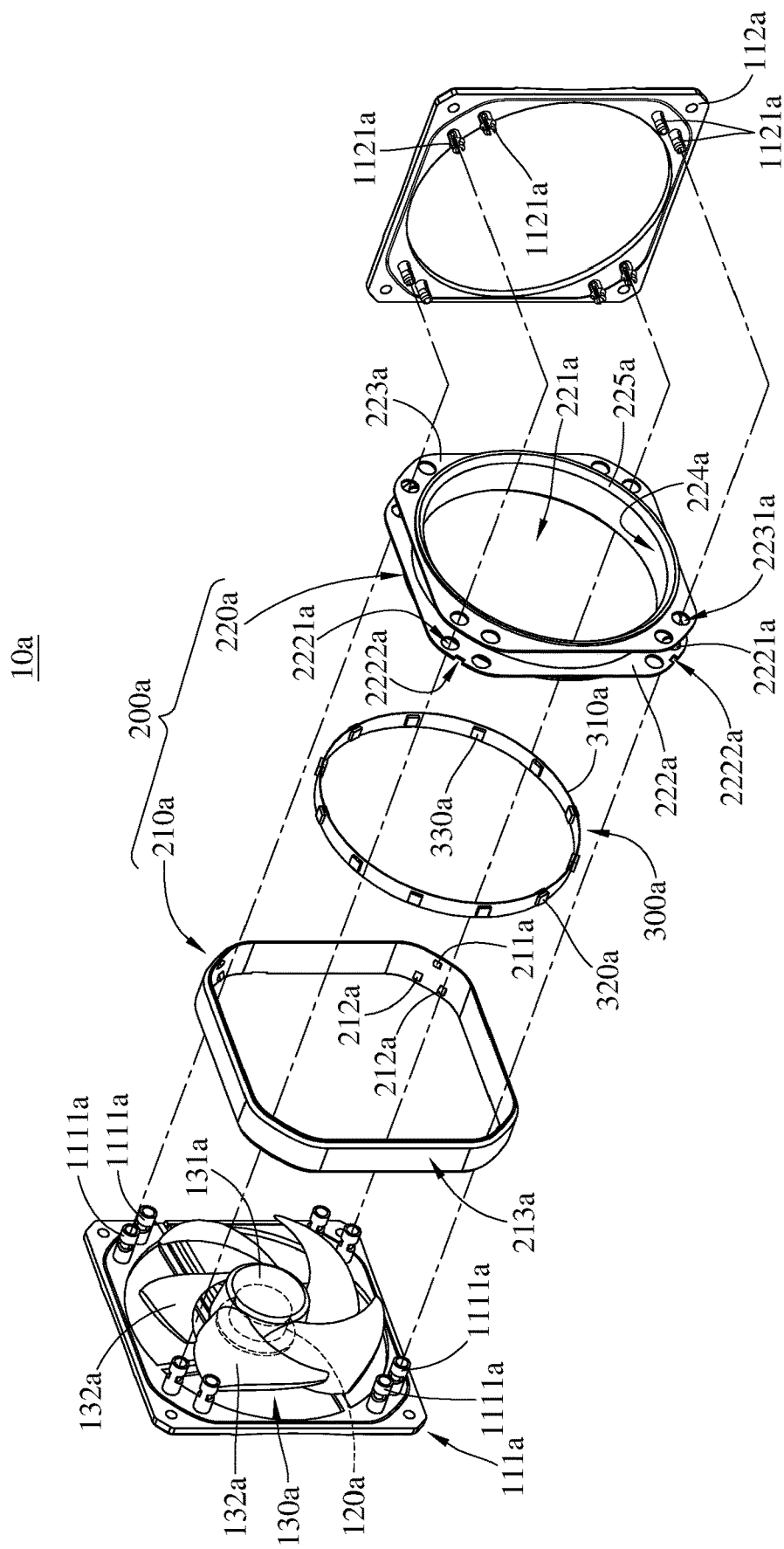
FIG. 2 is an exploded view of the luminous fan in FIG. 1.
Figure 3:
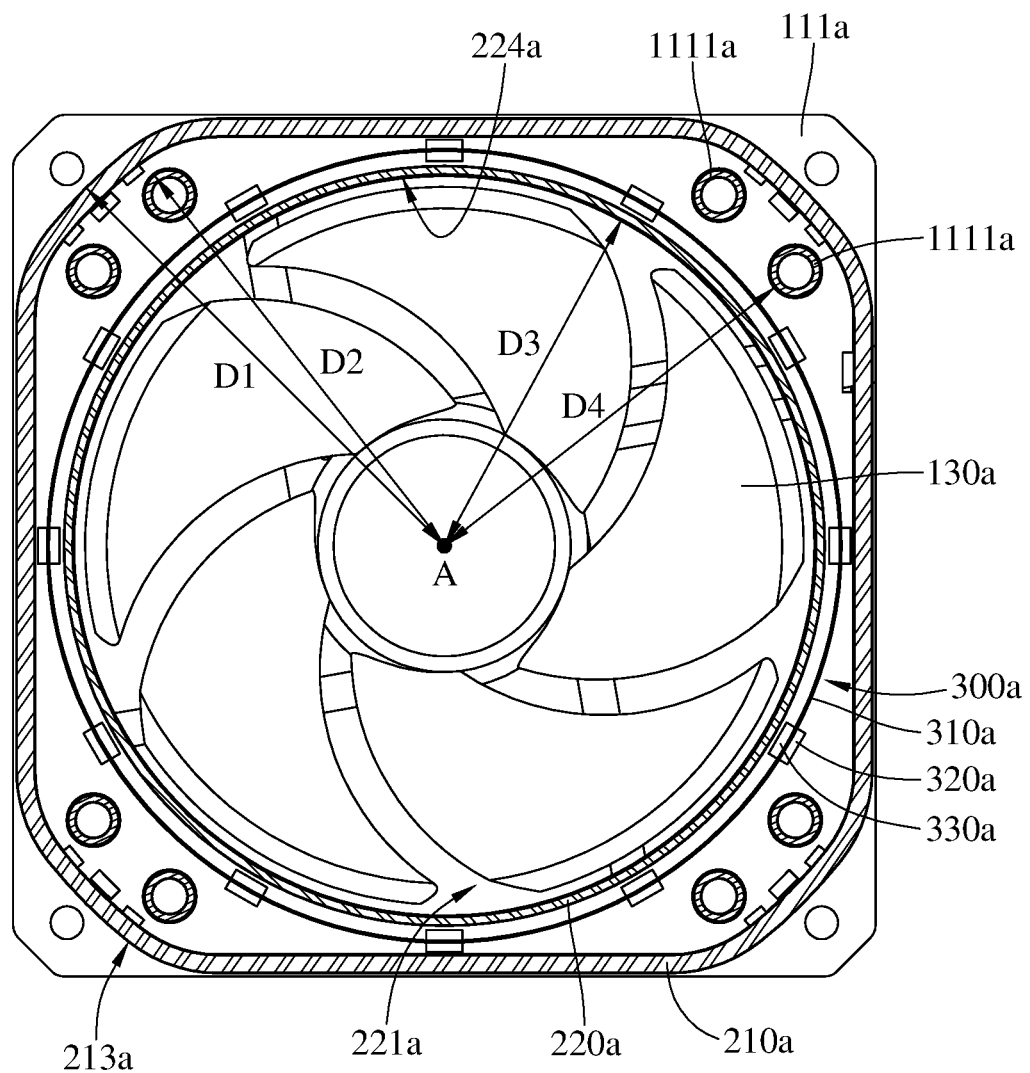
FIG. 3 is a cross-sectional view of the luminous fan in FIG. 1.
Figure 4:
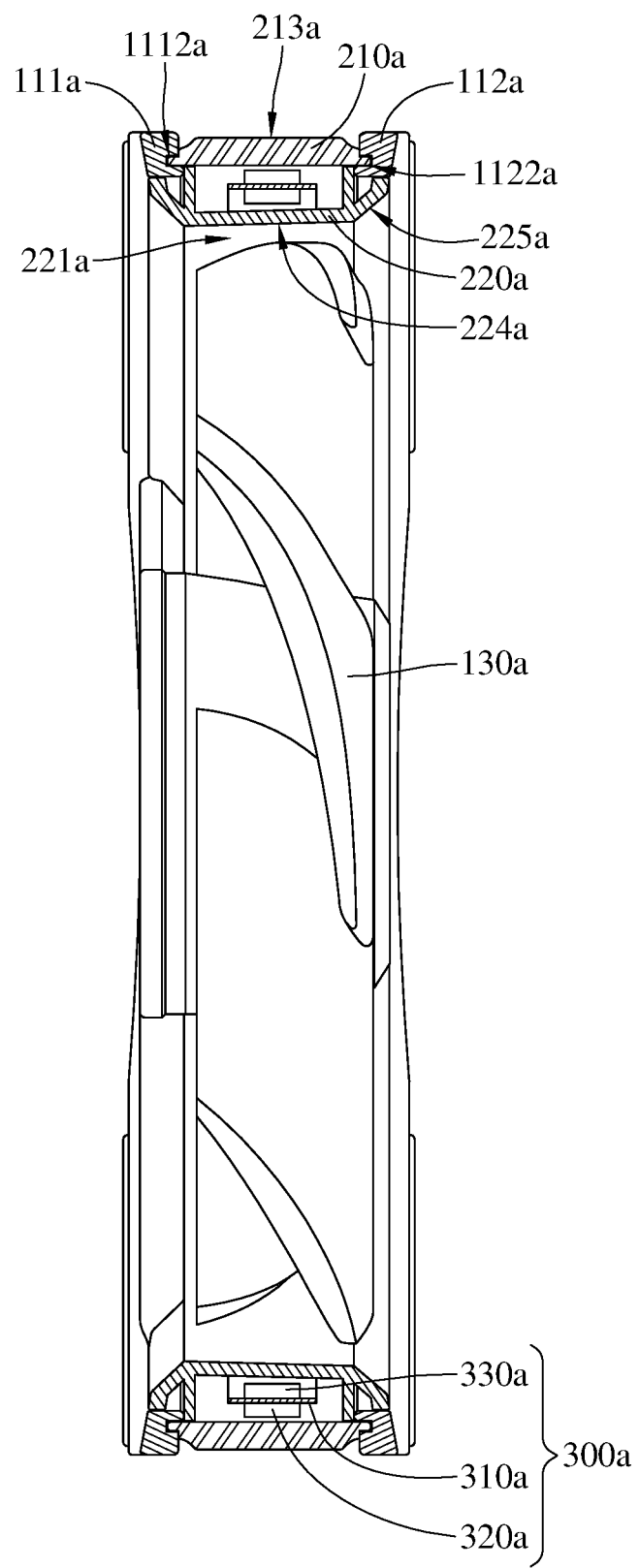
FIG. 4 is a cross-sectional view of the luminous fan in FIG. 1 taken from another viewpoint.

Firstly, please refer to FIGS. 1-4, FIG. 1 is a perspective view of a luminous fan according to a first embodiment of the disclosure, FIG. 2 is an exploded view of the luminous fan in FIG. 1, FIG. 3 is a cross-sectional view of the luminous fan in FIG. 1, and FIG. 4 is a cross-sectional view of the luminous fan in FIG. 1 taken from another viewpoint.

This embodiment provides a luminous fan 10a. The luminous fan 10a is, for example, an axial fan. It is known that the propeller of the axial fan can generate an air current flowing along an axis thereof. The luminous fan 10a includes a main body 100a, a light guide member 200a and a light source 300a.

The main body 100a includes a fan frame 110a, a driving component 120a and a propeller 130a. The fan frame 110a is, for example, formed by opaque plastic injection. In this embodiment, the fan frame 110a is divided into two pieces, one is a first carrier board 111a and the other is a second carrier board 112a. The first carrier board 111a has a plurality of first mounting parts 1111a. The first mounting parts 1111a are, for example, mounting components for being detachably mounted to the second carrier board 112a. The second carrier board 112a has a plurality of first mounting parts 1121a. The first mounting parts 1121a are mounting components compatible with and able to be fixed to the first mounting parts 1111a. That is, the first mounting parts 1121a are able to be detachably engaged with the first mounting parts 1111a so as to mount the first carrier board 111a onto the second carrier board 112a to constitute the fan frame 110a. The light guide member 200a can be mounted on the fan frame 110a, but the detail would be described in the following paragraphs. In this embodiment, the fan frame 110a is constituted of two plate pieces, but the present disclosure is not limited thereto. In some other embodiments, the fan frame may be made of one piece or constituted of more than three plate pieces. In addition, there may be one or more buffering pads disposed on the fan frame in order to reduce the operation vibration.

The driving component 120a is, for example, an electric motor. The driving component 120a is fixed on the first carrier board 111a via screwing or adhesive. The propeller 130a includes a hub 131a and a plurality of blades 132a. The hub 131a is installed on an output shaft (not shown) of the driving component 120a. The blades 132a are arranged around the outer surface of the hub 131a and extend outward. The propeller 130a is able to be rotated with respect to the fan frame 110a by being driven by the driving component 120a.

The light guide member 200a includes an outer light guide ring 210a and an inner light guide ring 220a. The outer light guide ring 210a is mounted on the fan frame 110a via the inner light guide ring 220a. In detail, the inner light guide ring 220a has an outer surface and an inner surface, the contour of the outer surface is approximately a square, and the inner surface forms an air channel 221a which is circular. The inner light guide ring 220a includes a first position-limiting plate 222a and a second position-limiting plate 223a at either side. The first position-limiting plate 222a and the second position-limiting plate 223a radially extend. The first position-limiting plate 222a has a plurality of second mounting parts 2221a, and the second position-limiting plate 223a has a plurality of second mounting parts 2231a. The second mounting parts 2221a and 2231a are, for example, through bores, and are respectively located at four corners of the inner light guide ring 220a. The second mounting parts 2221a and 2231a are respectively for the insertions of the first mounting parts 1111a and 1121a so as to be mounted on the fan frame 110a.

In addition, the first carrier board 111a has an annular positioning slot 1112a, and the second carrier board 112a has an annular positioning slot 1122a. When the inner light guide ring 220a is mounted to the first carrier board 111a and the second carrier board 112a, two opposite edges of the inner light guide ring 220a are respectively embedded into the annular positioning slot 1112a of the first carrier board 111a and the annular positioning slot 1122a of the second carrier board 112a, thereby improving the assembly strength between the fan frame 110a and the inner light guide ring 220a.

In addition, each corner of the first position-limiting plate 222a has an opening 2222a. The outer light guide ring 210a is, for example, a square ring shaped object. The outer light guide ring 210a, at each corner, has a first positioning block 211a and two second positioning blocks 212a formed on an inner surface thereof. The first positioning block 211a and two second positioning blocks 212a are arranged in a triangle. That is, the first positioning block 211a and two second positioning blocks 212a are not arranged in a straight line. With the first positioning block 211a and two second positioning blocks 212a, the outer light guide ring 210a is able to be mounted on the inner light guide ring 220a. In detail, to align the outer light guide ring 210a with the inner light guide ring 220a so as to let the first positioning blocks 211a of the outer light guide ring 210a to pass through the openings 2222a of the first position-limiting plate 222a, and then to let the first positioning block 211a and the second positioning blocks 212a to respectively press against the second position-limiting plate 223a and the first position-limiting plate 222a. By doing so, the outer light guide ring 210a is able to be fixed on the inner light guide ring 220a and surrounds the first mounting parts 1111a and 1121a and the second mounting parts 2221a and 2231a.

However, the present disclosure is not limited to how to engage the outer light guide ring 210a and the inner light guide ring 220a. For example, in some other embodiments, the outer light guide ring and the inner light guide ring may be fixed to each other by screws. In addition, the shape of the inner light guide ring 220a is not restricted. For example, in some other embodiments, both the contours of its outer and inner surface may be a circle. Furthermore, the locations of the second mounting parts 2221a and 2231a are not restricted, either. For example, in some other embodiments, the second mounting parts 2221a and 2231a may be located at a side of the inner light guide ring.

Moreover, in this embodiment, the outer light guide ring 210a is mounted on the fan frame 110a via the inner light guide ring 220a, but the present disclosure is not limited thereto. For example, in some other embodiments, the outer light guide ring may have the position-limiting plate and the mounting parts, and the inner light guide ring may have the positioning blocks, such that the outer light guide ring may be firstly mounted on the fan frame and then the inner light guide ring may be mounted on the fan frame via the outer light guide ring. Alternatively, the outer light guide ring and the inner light guide ring may not be directly fixed to each other but both directly fixed to the fan frame. For example, in some other embodiments, the fan frame may have a first fastening structure, the outer light guide ring and the inner light guide ring of the light guide member each have a second fastening structure. The first fastening structure and the second fastening structure are a block and a slot that can be detachably fixed to each other.

The light source 300a is disposed between the outer light guide ring 210a and the inner light guide ring 220a. The light source 300a includes, for example, a ring-shaped circuit board 310a and a plurality of light-emitting diodes 320a and 330a. The ring-shaped circuit board 310a surrounds the propeller 130a. The light-emitting diodes 320a are disposed on a side of the ring-shaped circuit board away from the propeller 130a. The light-emitting diodes 330a are disposed on a side of the ring-shaped circuit board facing the propeller 130a. In the other words, the light-emitting diodes 320a and the light-emitting diodes 330a are respectively located at two opposite sides of the ring-shaped circuit board 310a (i.e., the inner side and the outer side), such that the light source 300a can emit light from two surfaces. When the light source 300a is turned on, the light-emitting diodes 320a emit light toward the outer light guide ring 210a, and the light-emitting diodes 330a emit light toward the inner light guide ring 220a, such that the light emitted by the light source 300a can enter into the outer light guide ring 210a and the inner light guide ring 220a, causing the outer light guide ring 210a and the inner light guide ring 220a to illuminate.

In detail, the outer light guide ring 210a has a first ring-shaped illuminating surface 213a surrounding and facing away from the propeller 130a. The light entering into the outer light guide ring 210a can exit the outer light guide ring 210a via the first ring-shaped illuminating surface 213a. As shown in FIG. 3, a distance D1 between the first ring-shaped illuminating surface 213a and a rotation axis A of the propeller 130a is larger than a distance D2 between any one of the first mounting parts 1111a and the rotation axis A. As such, the outer light guide ring 210a surrounds the first mounting parts 1111a and 1121a and the second mounting parts 2221a and 2231a. That is, the first ring-shaped illuminating surface 213a is not blocked by the first mounting parts 1111a and 1121a and the second mounting parts 2221a and 2231a. Therefore, the outer light guide ring 210a can create a complete annulus of light (or a ring-shaped illumination) and an annular halo at the exterior of the luminous fan 10a. However, the first ring-shaped illuminating surface 213a may not be facing away from the propeller 130a. For example, in some other embodiments, when the distance D1 is determined to be larger than the distance D2, the first ring-shaped illuminating surface may not be facing away from the propeller, e.g., the first ring-shaped illuminating surface's normal line may be parallel to the axial direction of the propeller.

In addition, the inner light guide ring 220a has a second ring-shaped illuminating surface 224a surrounding and facing the propeller 130a. The light entering into the inner light guide ring 220a can exit the inner light guide ring 220a via the second ring-shaped illuminating surface 224a. As shown in FIG. 3, a distance D3 between the second ring-shaped illuminating surface 224a and the rotation axis A is smaller than a distance D4 between any one of the first mounting parts 1111a and the rotation axis A. As such, the inner light guide ring 220a also surrounds the first mounting parts 1111a and 1121a and the second mounting parts 2221a and 2231a. That is, the second ring-shaped illuminating surface 224a is not blocked by the first mounting parts 1111a and 1121a and the second mounting parts 2221a and 2231a, either. Therefore, the inner light guide ring 220a can create a complete annulus of light (or a ring-shaped illumination) and an annular halo at the interior of the luminous fan 10a.

In short, since the first mounting parts 1111a and 1121a and the second mounting parts 2221a and 2231a are located between the first ring-shaped illuminating surface 213a and the second ring-shaped illuminating surface 224a, and the first ring-shaped illuminating surface 213a and the second ring-shaped illuminating surface 224a do not face the first mounting parts 1111a and 1121a and the second mounting parts 2221a and 2231a, the light exiting from the first ring-shaped illuminating surface 213a and the second ring-shaped illuminating surface 224a is prevented from being blocked by the first mounting parts 1111a and 1121a and the second mounting parts 2221a and 2231a, thereby achieving a desired lighting effect of the luminous fan 10a. However, such configuration may be modified, and the modification will be explained later on.

The inner light guide ring 220a has a third ring-shaped illuminating surface 225a which is located between the first ring-shaped illuminating surface 213a and the second ring-shaped illuminating surface 224a. In this embodiment, the third ring-shaped illuminating surface 225a has an acute angle to the first ring-shaped illuminating surface 213a, so the third ring-shaped illuminating surface 225a is inclined with respect to the rotation axis A. As such, the third ring-shaped illuminating surface 225a can create another annulus of light emitting from the front side of the luminous fan 10a.

However, the present disclosure is not limited to the acute between the third ring-shaped illuminating surface 225a and the first ring-shaped illuminating surface 213a. For example, in some other embodiments, the third ring-shaped illuminating surface may be perpendicular to the first ring-shaped illuminating surface. In addition, the present disclosure is not limited to the location of the third ring-shaped illuminating surface 225a. For example, in some other embodiments, the third ring-shaped illuminating surface may be located on the outer light guide ring.

Furthermore, the first ring-shaped illuminating surface 213a, the second ring-shaped illuminating surface 224a and the third ring-shaped illuminating surface 225a may each be a matte surface, such that the light exiting from the first ring-shaped illuminating surface 213a, the second ring-shaped illuminating surface 224a and the third ring-shaped illuminating surface 225a can be turned into a soft diffuse light.

According to the above discussion, the luminous fan 10a has three illuminating surfaces (i.e., the first ring-shaped illuminating surface 213a, the second ring-shaped illuminating surface 224a and the third ring-shaped illuminating surface 225a) respectively emitting light in three directions, but the present disclosure is not limited thereto. In some other embodiments, the luminous fan may only have a single illuminating surface, and the illuminating surface may be located at the outer side or the front side of the luminous fan; alternatively, the luminous fan may have four illuminating surfaces respectively located at the outer side, the inner side, the front side and the rear side of the luminous fan.

On the other hand, the light-emitting diodes 320a and 330a may be replaced by another type of illuminator, such as fluorescent light units or organic light-emitting diodes (OLEDs).

In this embodiment, the light guide member 200a is made of light-guiding material, such as polymethyl methacrylate (PMMA), cyclic olefins polymer (COP) or polycarbonate (PC), allowing light to pass therethrough. The light guide member 200a is more transparent than the fan frame 110a. When the light from the light source 300a is emitted into the light guide member 200a, total internal reflection occurs so that the light can be transmitted toward the other side of the light guide member 200a, thereby improving the utilization and uniformity of the light source 300a.

In this embodiment, the propeller 130a is, for example, made of made of light-guiding material, such that the light exiting from the second ring-shaped illuminating surface 224a can enter into the propeller 130a and cause the propeller 130a to illuminate, but the present disclosure is not limited thereto. In some other embodiments, the propeller 130a may be made of a material impermeable to light.

Figure 5:
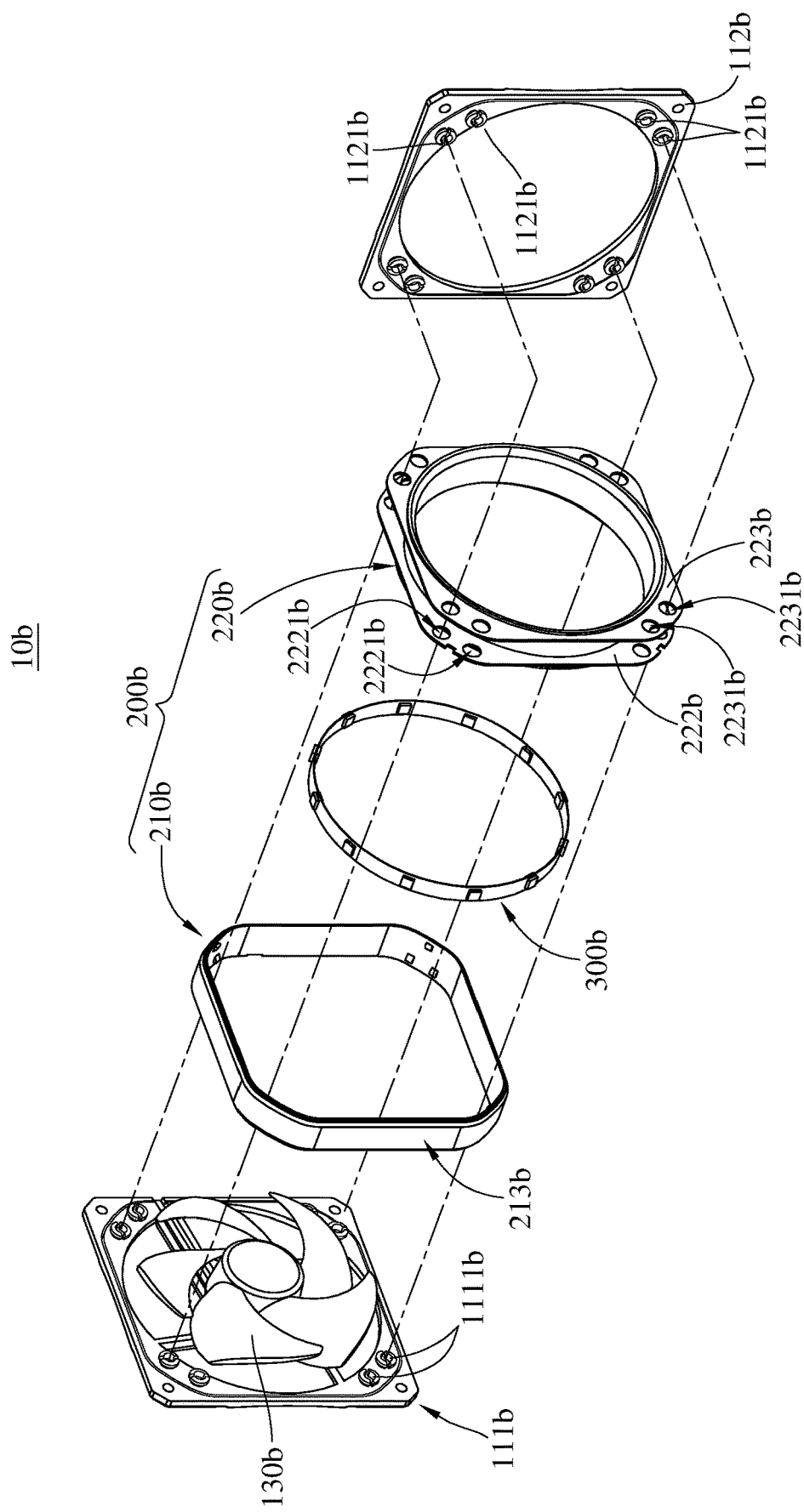
FIG. 5 is an exploded view of a luminous fan according to a second embodiment of the disclosure.

Please refer to FIG. 5. FIG. 5 is an exploded view of a luminous fan according to a second embodiment of the disclosure. This embodiment provides a luminous fan 10b. The luminous fan 10b is similar to the previous luminous fan 10a; for example, in the luminous fan 10b, its outer light guide ring 210b and inner light guide ring 220b are mounted in the way the same as the light source 300b and the light guide member 200b as shown in FIG. 1. Thus, the repetitive details are omitted for simplicity, and the following paragraphs only illustrate the differences between these embodiments.

For example, in the luminous fan 10b, its first carrier board 111b and second carrier board 112b are mounted to each other via a light guide member 200b instead of being directly mounted to each other. In detail, the inner light guide ring 220b has a first position-limiting plate 222b and a second position-limiting plate 223b respectively located at two opposite sides thereof. The first position-limiting plate 222b has a plurality of second mounting parts 2221b, and the second position-limiting plate 223b has a plurality of second mounting parts 2231b. The second mounting parts 2221b and 2231b are, for example, holes, and are respectively located at four corners of the inner light guide ring 220b.

The first carrier board 111b has a plurality of first mounting parts 1111b, and the first mounting parts 1111b are, for example, mounting protrusions capable of being fixed to the second mounting parts 2221b of the first position-limiting plate 222b. The second carrier board 112b has a plurality of first mounting parts 1121b, and the first mounting parts 1121b are, for example, mounting protrusions capable of being fixed to the second mounting parts 2231b of the second position-limiting plate 223b.

As such, the first mounting parts 1111b of the first carrier board 111b and the first mounting parts 1121b of the second carrier board 112b have no need to directly connect to each other. Thus, the first mounting parts 1111b and 1121b are shorter, thereby reducing the light blocking of the light source.

More importantly, in the case that the inner light guide ring 220b, the first carrier board 111b and the second carrier board 112b are mounted together as discussed above, the outer light guide ring 210b may be changed its shape to be much closer to the propeller 130 than the first mounting parts 1111b and 1121b. That is, the case that the distance D1 between the first ring-shaped illuminating surface 213a and the rotation axis A is larger than the distance D2 between the first mounting part 1111a and the rotation axis A is not a necessary condition for forming a complete annulus of light (or a ring-shaped illumination) and an annular halo. As long as the inner light guide ring, the first carrier board and the second carrier board are mounted to each other by following the way discussed in this embodiment, the distance between the first ring-shaped illuminating surface and the rotation axis may be smaller than the distance between the first mounting part and the rotation axis. In addition, in this embodiment, the components may be engaged to each other via screwing or adhesive.

Figure 6:
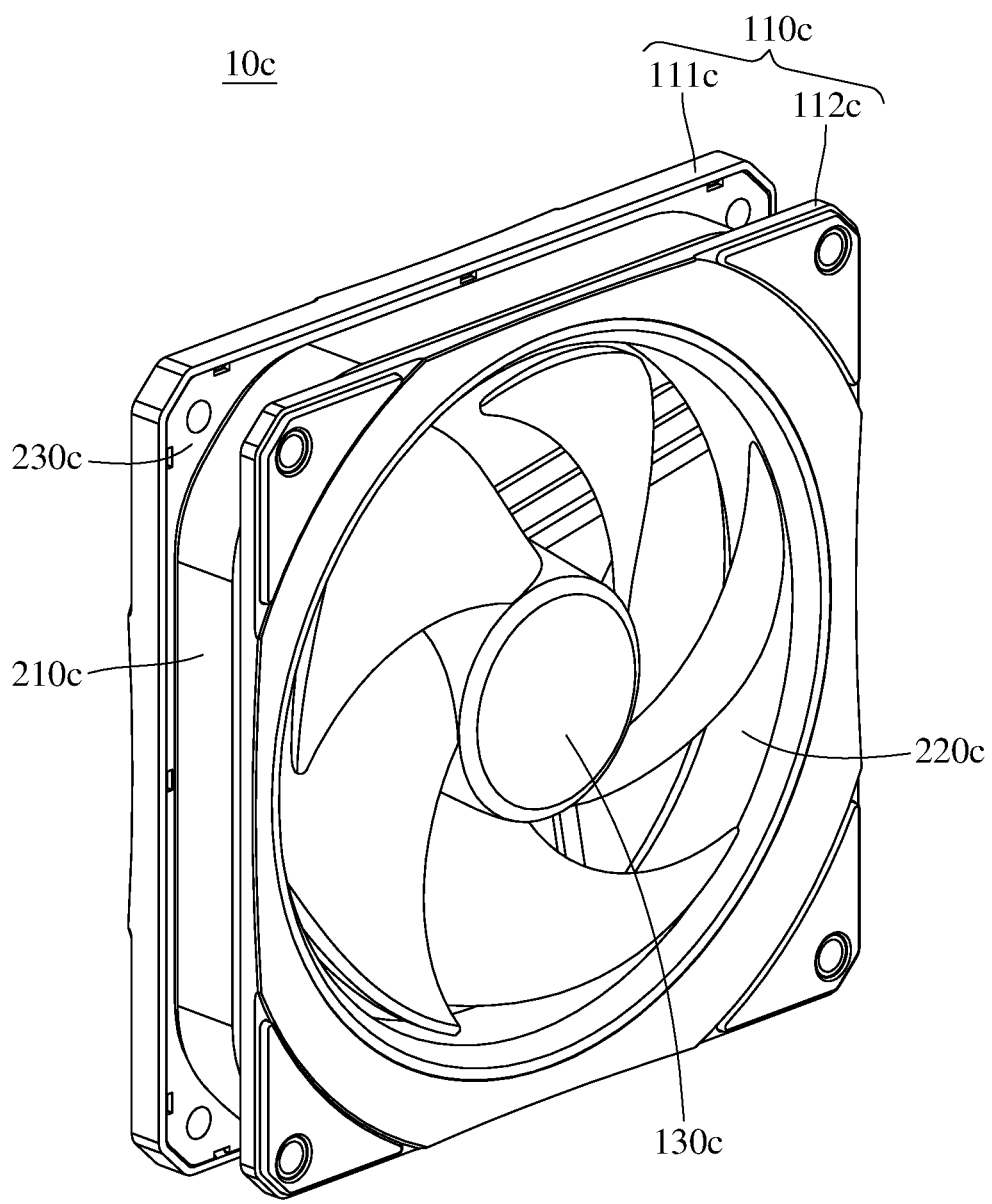
FIG. 6 is a perspective view of a luminous fan according to a third embodiment of the disclosure.
Figure 7:
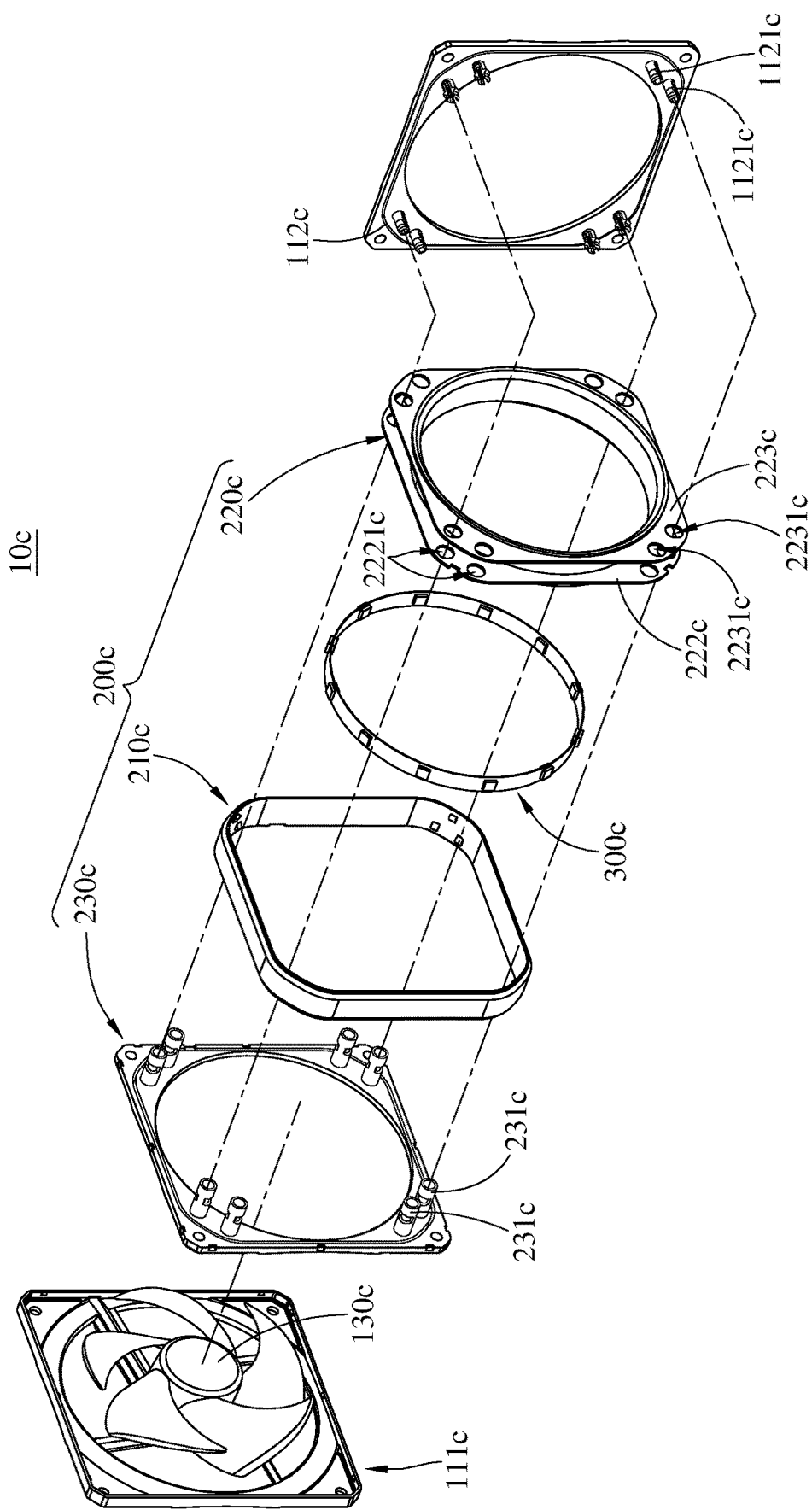
FIG. 7 is an exploded view of the luminous fan in FIG. 6.

Please refer to FIGS. 6 and 7, FIG. 6 is a perspective view of a luminous fan according to a third embodiment of the disclosure, and FIG. 7 is an exploded view of the luminous fan in FIG. 6.

This embodiment provides a luminous fan 10c. The luminous fan 10c is similar to the previous luminous fan 10a; for example, in the luminous fan 10b, its light source 300c and light guide member 200c are mounted in the way the same as that as shown in FIG. 1. Thus, the repetitive details are omitted for simplicity, and the following paragraphs only illustrate the differences between these embodiments.

For example, the luminous fan 10c includes a fan frame 110c including a first carrier board 111c and a second carrier board 112c, and the first carrier board 111c and the second carrier board 112c are mounted to each other via the light guide member 200c instead of being directly mounted to each other. In detail, the light guide member 200c includes an outer light guide ring 210c, an inner light guide ring 220c and a light guide carrier board 230c. The outer light guide ring 210c is sleeved on the inner light guide ring 220c. The inner light guide ring 220c has a first position-limiting plate 222c and a second position-limiting plate 223c respectively located at two opposite sides thereof. The first position-limiting plate 222c has a plurality of mounting holes 2221c, and the second position-limiting plate 223c has a plurality of mounting holes 2231c. The mounting holes 2221c and 2231c are respectively located at four corners of the inner light guide ring 220c. The light guide carrier board 230c has a plurality of mounting protrusions 231c. The mounting protrusions 231c are configured to be inserted into the mounting holes 2221c and 2231c.

The first carrier board 111c, which is mounted with a propeller 130c, is fixed on a side of the light guide carrier board 230c facing away the inner light guide ring 220c by, for example, screwing. The second carrier board 112c has a plurality of mounting protrusions 1121c which are configured to be inserted into the mounting holes 2221c and 2231c and then to be fixed to the mounting protrusions 231c of the light guide carrier board 230c. As such, the first carrier board 111c and the second carrier board 112c are mounted to each other via the light guide member 200c.

The outer light guide ring 210c is mounted on the inner light guide ring 220c and surrounds the mounting protrusions 1121c and 231c. That is, the outer side of the outer light guide ring 210c is not covered by the mounting protrusions 1121c and 231c, thus the outer light guide ring 210c can create a complete annulus of light (or a ring-shaped illumination) and an annular halo at the exterior of the luminous fan 10c. In addition, the mounting protrusions 231c are also permeable to light, thus although the mounting protrusions 231c cover a part of the light source 300c, they still allow the light from the light source 300c to pass through. Furthermore, part of the light guide carrier board 230c protrudes from the outer light guide ring 210c, providing an additional luminous area.

Figure 8:
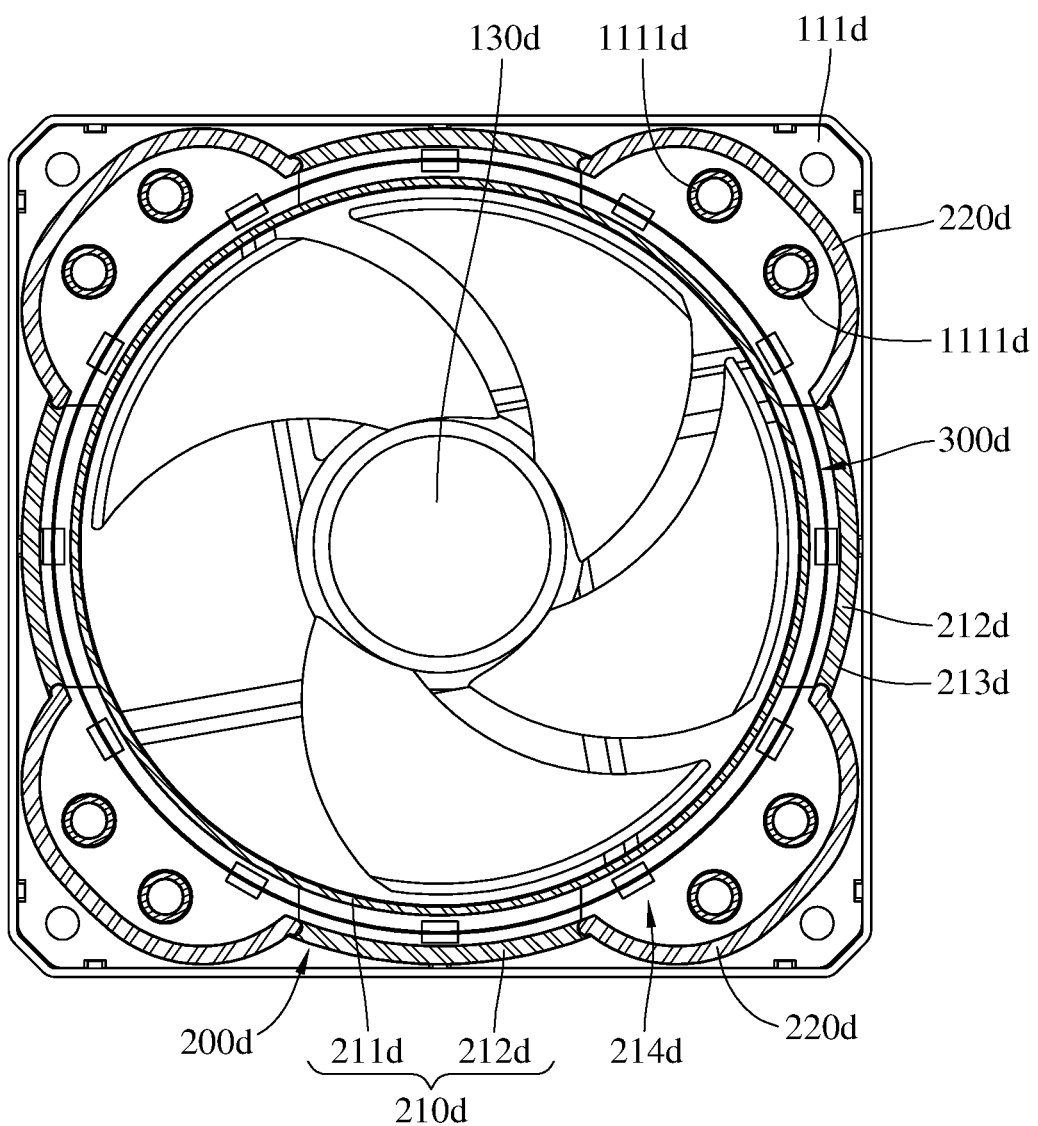
FIG. 8 is a cross-sectional view of a luminous fan according to a fourth embodiment of the disclosure.
Figure 9:
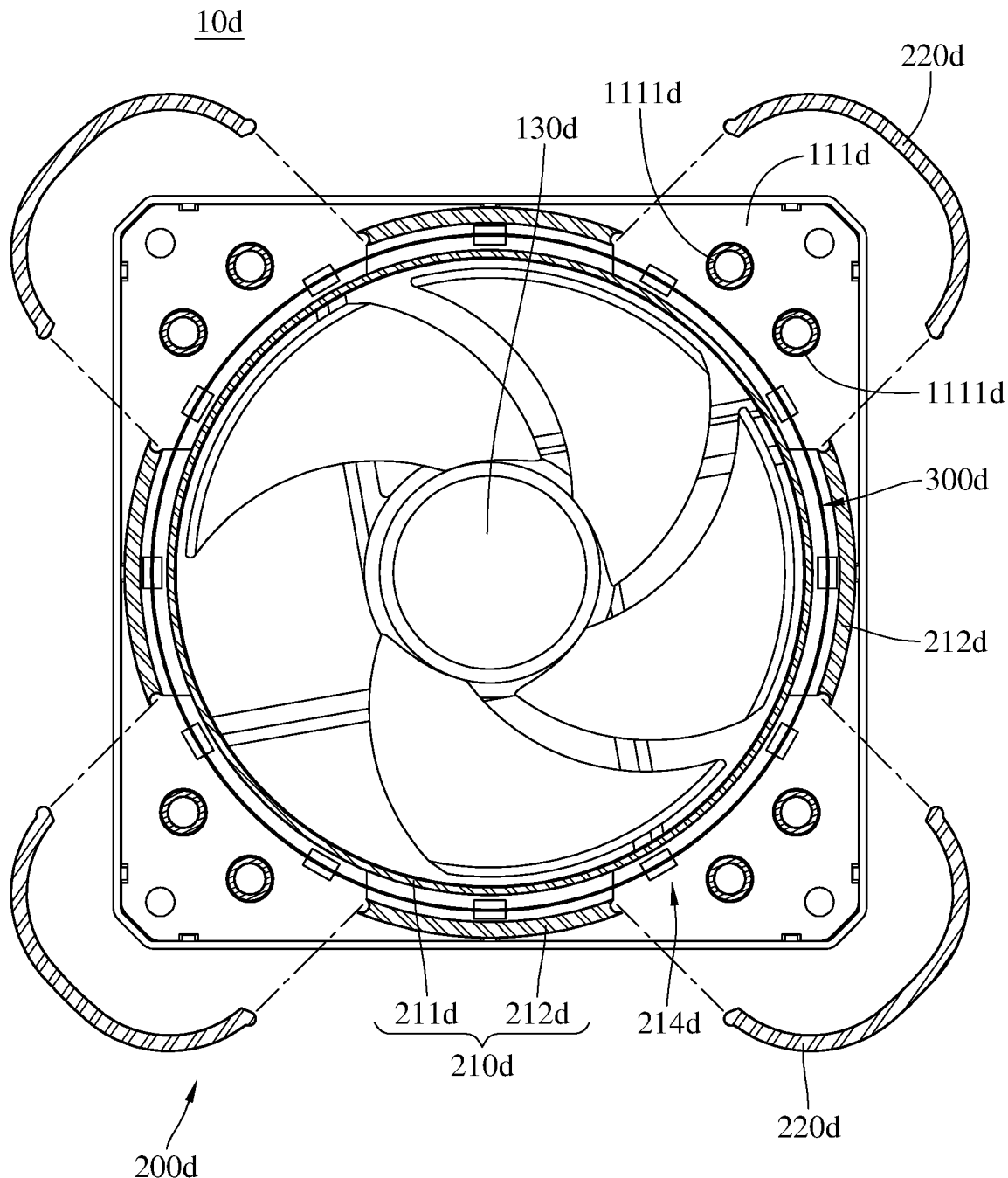
FIG. 9 is an exploded view of a light guide member in FIG. 8.

Please refer to FIGS. 8 and 9, FIG. 8 is a cross-sectional view of a luminous fan according to a fourth embodiment of the disclosure, and FIG. 9 is an exploded view of a light guide member in FIG. 8.

This embodiment provides a light guide member 200d. The light guide member 200d includes a light guide ring 210d and a plurality of second outer connecting pieces 220d. The light guide ring 210d includes an inner ring-shaped component 211d and a plurality of first outer connecting pieces 212d. The inner ring-shaped component 211d surrounds a propeller 130d.

The first outer connecting pieces 212d extends from the outer edge of the inner ring-shaped component 211d and is located at the exterior of the inner ring-shaped component 211d. Every two adjacent first outer connecting pieces 212d are spaced apart by an opening 214d. In this embodiment, there are four openings 214d respectively located at the corners of the light guide member 200d. In addition, there is a gap between the inner ring-shaped component 211d and the first outer connecting pieces 212d, and a light source 300d is located in the gap.

In addition, each side of the second outer connecting piece 220d has a male engaging part, and each side of the first outer connecting piece 212d has a female engaging part that is able to be engaged with the male engaging part, such that the second outer connecting pieces 220d are able to be fixed to the first outer connecting pieces 212d so as to form a first ring-shaped illuminating surface 213d with the first outer connecting pieces 212d. The first ring-shaped illuminating surface 213d surrounds a plurality of first mounting parts 1111d on a first carrier board 111d. That is, the first ring-shaped illuminating surface 213d is not covered by the first mounting parts 1111d, thus the light guide member 200d can create a complete annulus of light (or a ring-shaped illumination) and an annular halo at the exterior of the luminous fan 10d.

In this embodiment, the contour of the first ring-shaped illuminating surface 213d is not restricted, it can be changed according to actual requirements. For example, in some other embodiments, two of the second outer connecting pieces may stick out of the first carrier board 111d in order to create a halo of the contour of Mickey Mouse. In this embodiment, the first outer connecting pieces 212d and the second outer connecting pieces 220d are detachably fixed together, thus the user is able to assemble the first outer connecting pieces 212d and the second outer connecting pieces 220d to create a continuous line of light or to remove the second outer connecting pieces 220d to create a discontinuous line of light.

In addition, the quantity of the openings 214d and the quantity of the second outer connecting pieces 220d are both four, but the present disclosure is not limited thereto. In some other embodiments, both the quantity of the openings and the quantity of the second outer connecting pieces may be two.

Figure 11:
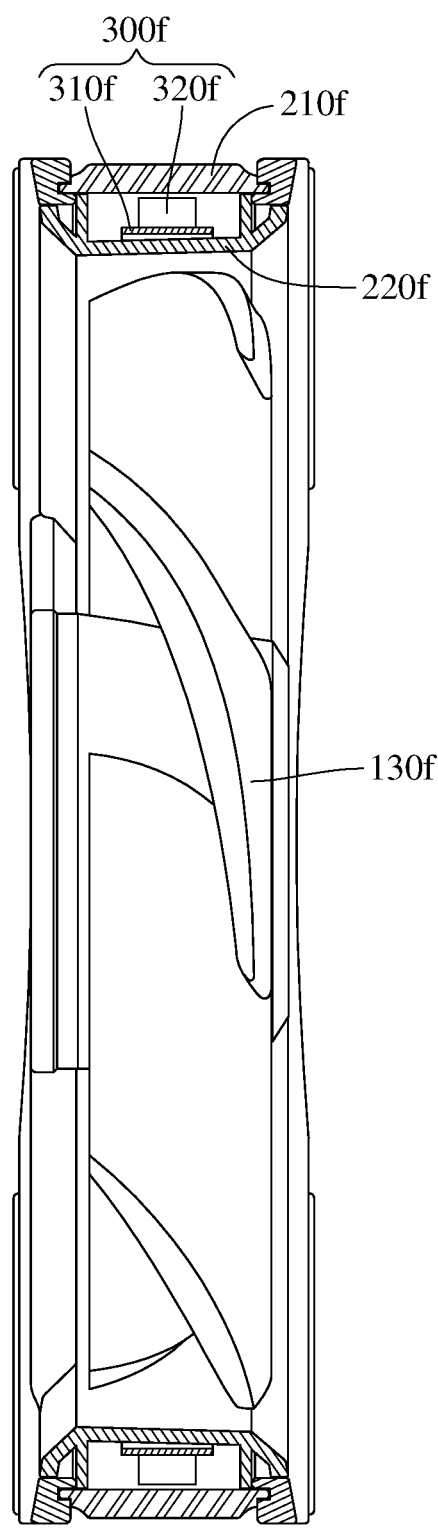
FIG. 11 is a cross-sectional view of a luminous fan according to a sixth embodiment of the disclosure.
Figure 12:
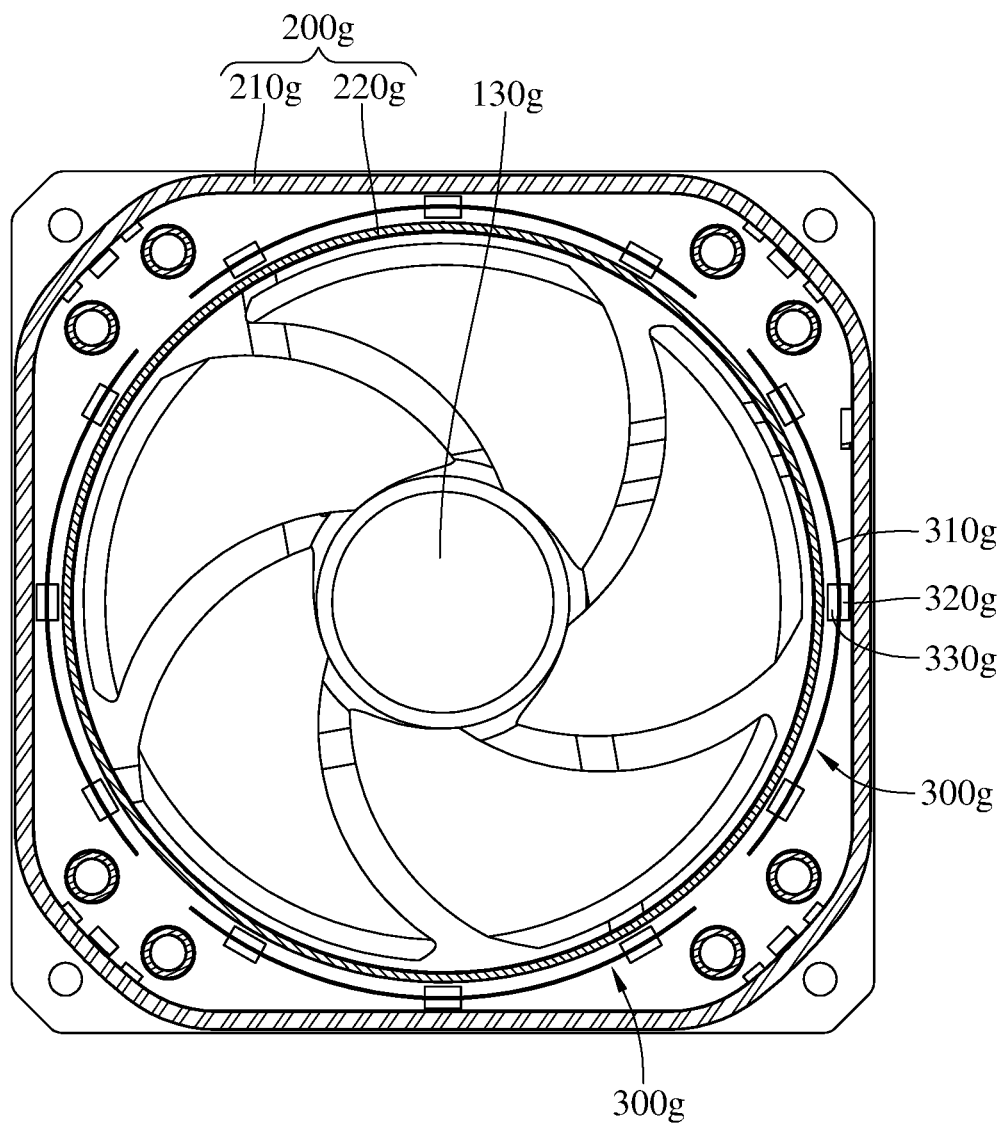
FIG. 12 is a cross-sectional view of a luminous fan according to a seventh embodiment of the disclosure.

Furthermore, the present disclosure is not limited to the configuration of the light source in FIG. 1. Please refer to FIGS. 10 to 12, FIG. 10 is a cross-sectional view of a luminous fan according to a fifth embodiment of the disclosure, FIG. 11 is a cross-sectional view of a luminous fan according to a sixth embodiment of the disclosure, and FIG. 12 is a cross-sectional view of a luminous fan according to a seventh embodiment of the disclosure.

Figure 10:
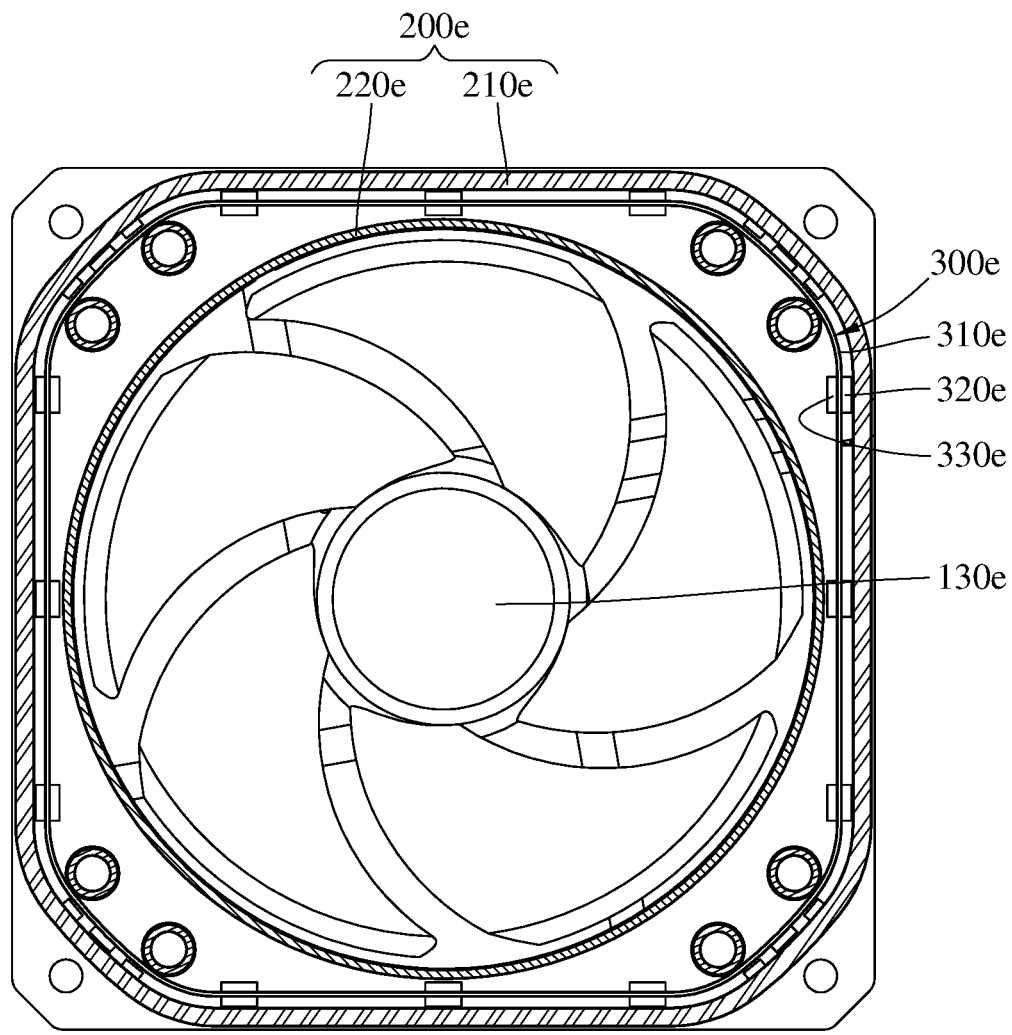
FIG. 10 is a cross-sectional view of a luminous fan according to a fifth embodiment of the disclosure.

As shown in FIG. 10, a light source 300e includes a ring-shaped circuit board 310e and a plurality of light-emitting diode 320e and 330e. The ring-shaped circuit board 310e surrounds a propeller 130e, the light-emitting diodes 320e are disposed on an outer surface of the ring-shaped circuit board 310e, and the light-emitting diodes 330e are disposed on an inner surface of the ring-shaped circuit board 310e. That is, the light source 300e can emit light from two surfaces. The difference is that the light source 300e is disposed on a side of an outer light guide ring 210e facing an inner light guide ring 220e.

However, it is noted that the light source may be modified to only emit light from one surface. As shown in FIG. 11, a light source 300f includes a ring-shaped circuit board 310f and a plurality of light-emitting diodes 320f. The ring-shaped circuit board 310f is disposed on an inner light guide ring 220f and surrounds a propeller 130f, and the light-emitting diodes 320f are disposed on an outer surface of the ring-shaped circuit board 310f. That is, the light source 300e only can emit light from one surface. Even so, the light being emitted into the outer light guide ring 210f still can exit out of the inner light guide ring 220f with the help of total internal reflection because the inner light guide ring 220f is connected to the outer light guide ring 210f.

On the contrary, in the cases that the light-emitting diodes are only disposed on the inner surface of the ring-shaped circuit board, the light being emitted into the inner light guide ring is able to exit out of the outer light guide ring with the help of total internal reflection.

Then, as shown in FIG. 12, there are a plurality of light sources 300g, each light source 300g includes a circuit board 310g and a plurality of light-emitting diodes 320g and 330g. The light-emitting diodes 320g are disposed on an outer surface of the circuit board 310g, and the light-emitting diodes 330g are disposed on an inner surface of the circuit board 310g. The light sources 300g are disposed on the inner light guide ring 220g and surrounds a propeller 130g. It is noted that the light sources 300g may be disposed on the outer light guide ring 210g, and each of them may be modified to only emit light from one surface.

Figure 13:
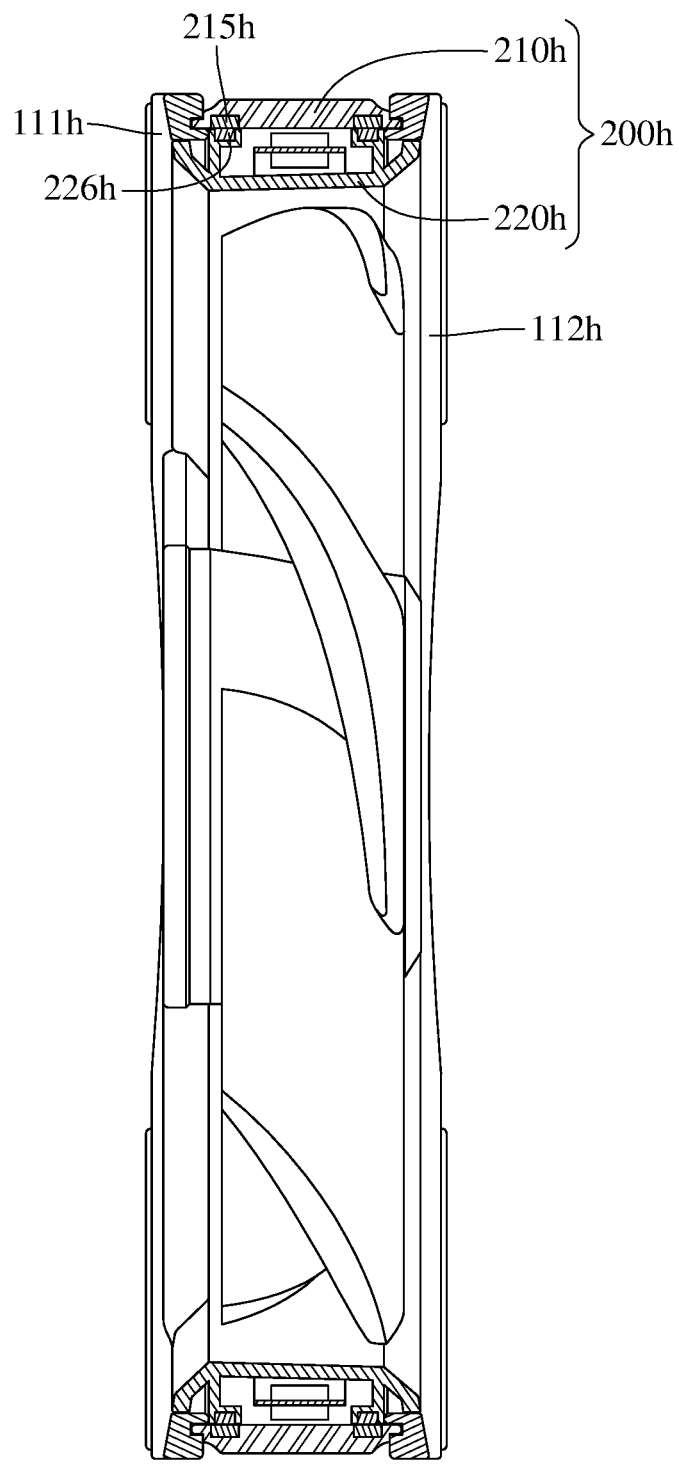
FIG. 13 is a cross-sectional view of a luminous fan according to an eighth embodiment of the disclosure.

Additionally, the present disclosure is not limited to how the outer light guide ring and the inner light guide ring are mounted to each other. Please refer to FIG. 13. FIG. 13 is a cross-sectional view of a luminous fan according to an eighth embodiment of the disclosure.

In this embodiment, a light guide member 200h includes an outer light guide ring 210h and an inner light guide ring 220h. The outer light guide ring 210h has a plurality of first magnetic components 215h, and the inner light guide ring 220h has a plurality of second magnetic components 226h. The second magnetic components 226h attract the first magnetic components 215h. The outer light guide ring 210h is able to be fixed on the inner light guide ring 220h via the second magnetic components 226h and the first magnetic components 215h. In this embodiment, the first magnetic components 215h and the second magnetic components 226h are, for example, permanent magnets or electromagnets.

Also, in this embodiment, the outer light guide ring 210h is partially embedded into position slots on a first carrier board 111h and a second carrier board 112h, such that the outer light guide ring 210h is much firmly mounted on the inner light guide ring 220. However, such position slots are optional. In some other embodiments, the outer light guide ring may not be embedded into the first carrier board and the second carrier board. Furthermore, in the case that the outer light guide ring is not embedded into the first carrier board and the second carrier board, the outer light guide ring may be made of a flexible material to wrap on the luminous fan and to be magnetically fixed on the inner light guide ring through the magnetic components.

Figure 14:
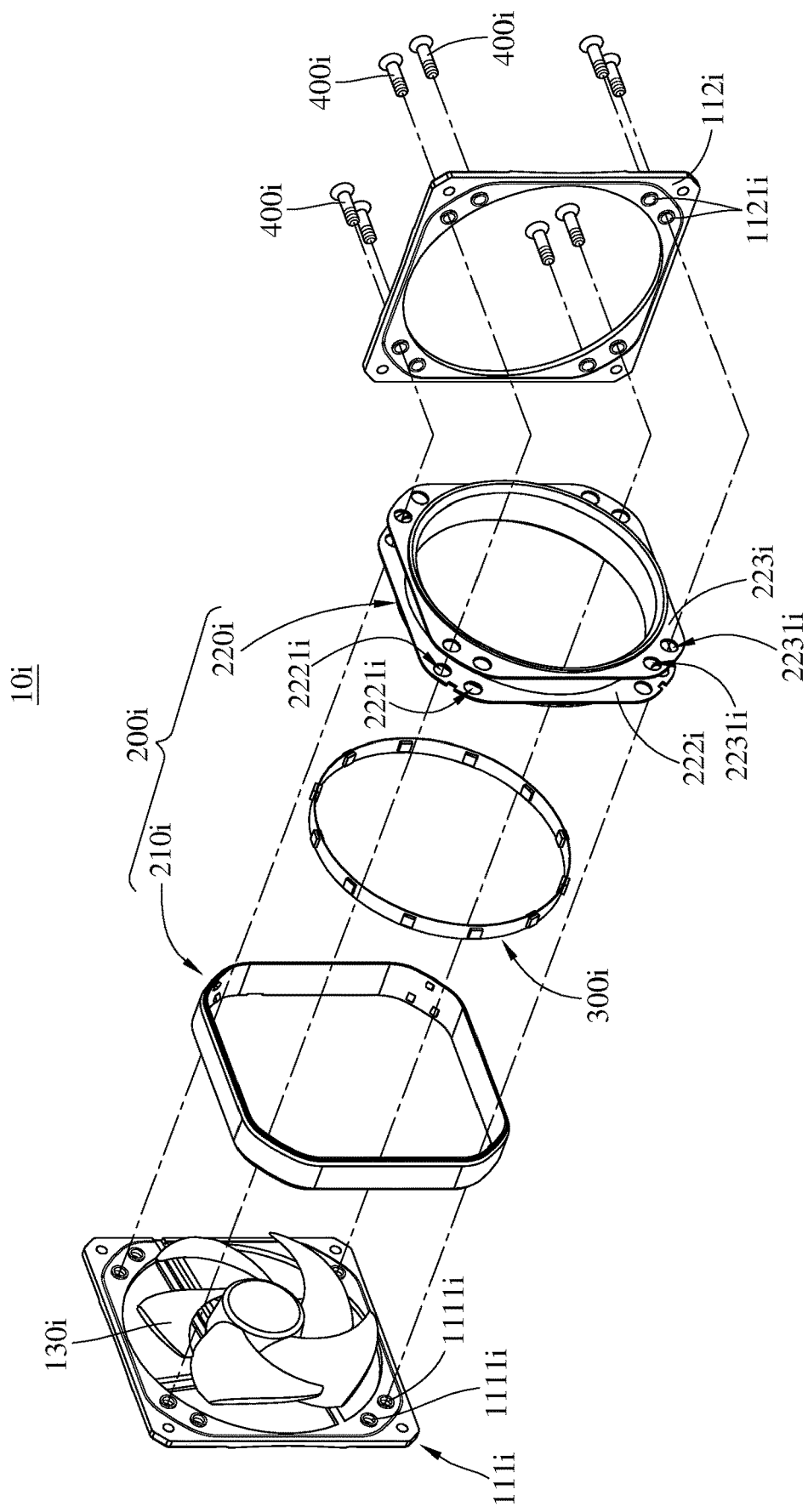
FIG. 14 is a cross-sectional view of a luminous fan according to a ninth embodiment of the disclosure.

Moreover, the first carrier board, the second carrier board and the light guide member may not be mounted together through the mounting protrusion and the through bore. Please refer to FIG. 14, FIG. 14 is a cross-sectional view of a luminous fan according to a ninth embodiment of the disclosure.

In this embodiment, a luminous fan 10i includes a first carrier board 111i, a second carrier board 112i, a propeller 130i, a light guide member 200i, a light source 300i and a plurality of fasteners 400i. The first carrier board 111i has a plurality of screw holes 1111i, and the second carrier board 112i has a plurality of through bores 1121i. The propeller 130i is mounted on the first carrier board 111i. The light guide member 200i includes an outer light guide ring 210i and an inner light guide ring 220i. The inner light guide ring 220i has a first position-limiting plate 222i and a second position-limiting plate 223i opposite to each other. The first position-limiting plate 222i has a plurality of through bores 2221i, and the second position-limiting plate 223i has a plurality of through bores 2231i. The inner light guide ring 220i is disposed between the first carrier board 111i and the second carrier board 112i, and the fasteners 400i are respectively disposed through the through bores 1121i of the second carrier board 112i, the through bores 2231i of the second position-limiting plate 223i, the through bores 2221i of the first position-limiting plate 222i, and screwed into the screw holes 1111i of the first carrier board 111i. The outer light guide ring 210i is fixed on the inner light guide ring 220i and surrounds the fasteners 400i. The light source 300i is located between the outer light guide ring 210i and the inner light guide ring 220i.

The outer light guide ring 210i surrounds the fasteners 400i. That is, the outer light guide ring 210i is not blocked by the fasteners 400i. Therefore, the outer light guide ring 210i can create a complete annulus of light (or a ring-shaped illumination) and an annular halo at the exterior of the luminous fan 10i.

Figure 15:
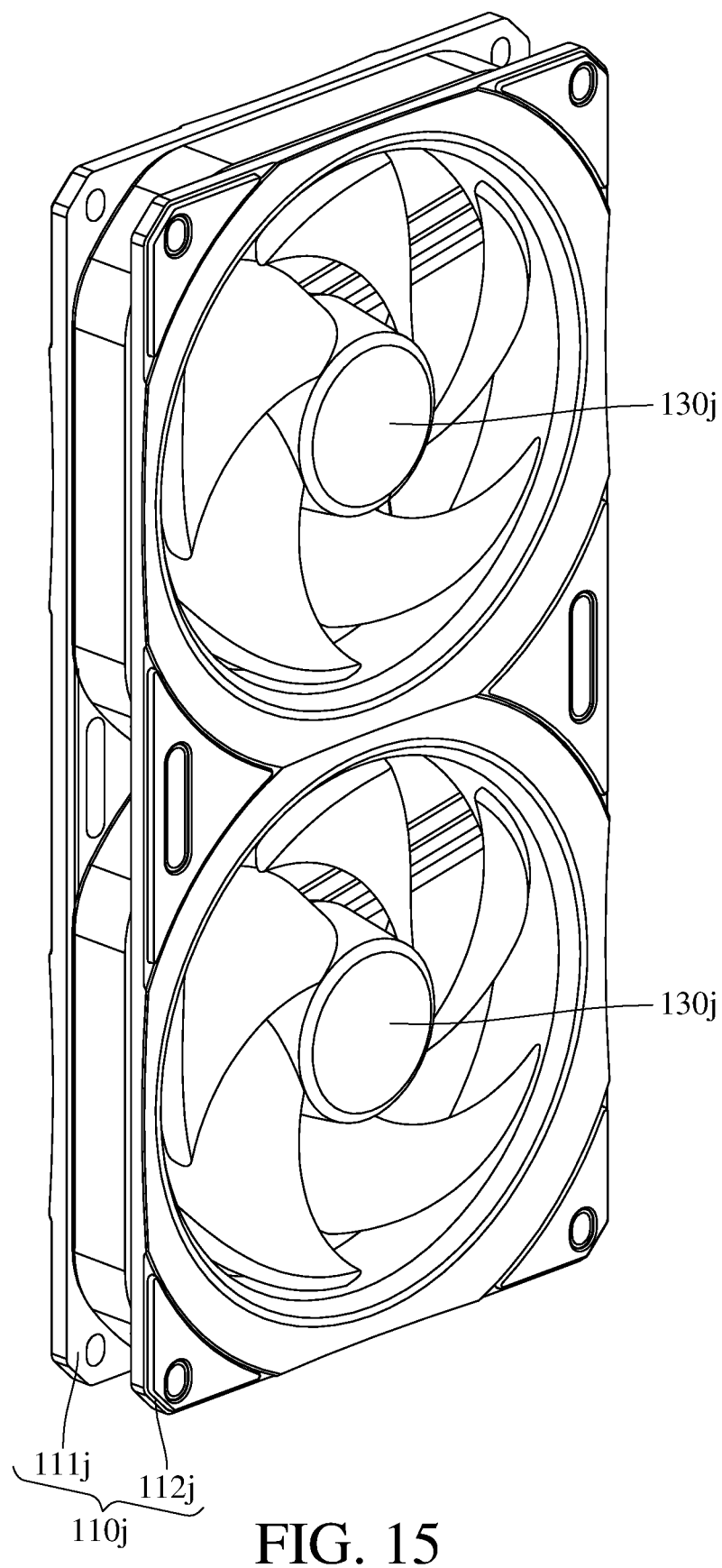
FIG. 15 is a cross-sectional view of a luminous fan according to a tenth embodiment of the disclosure.
Figure 16:
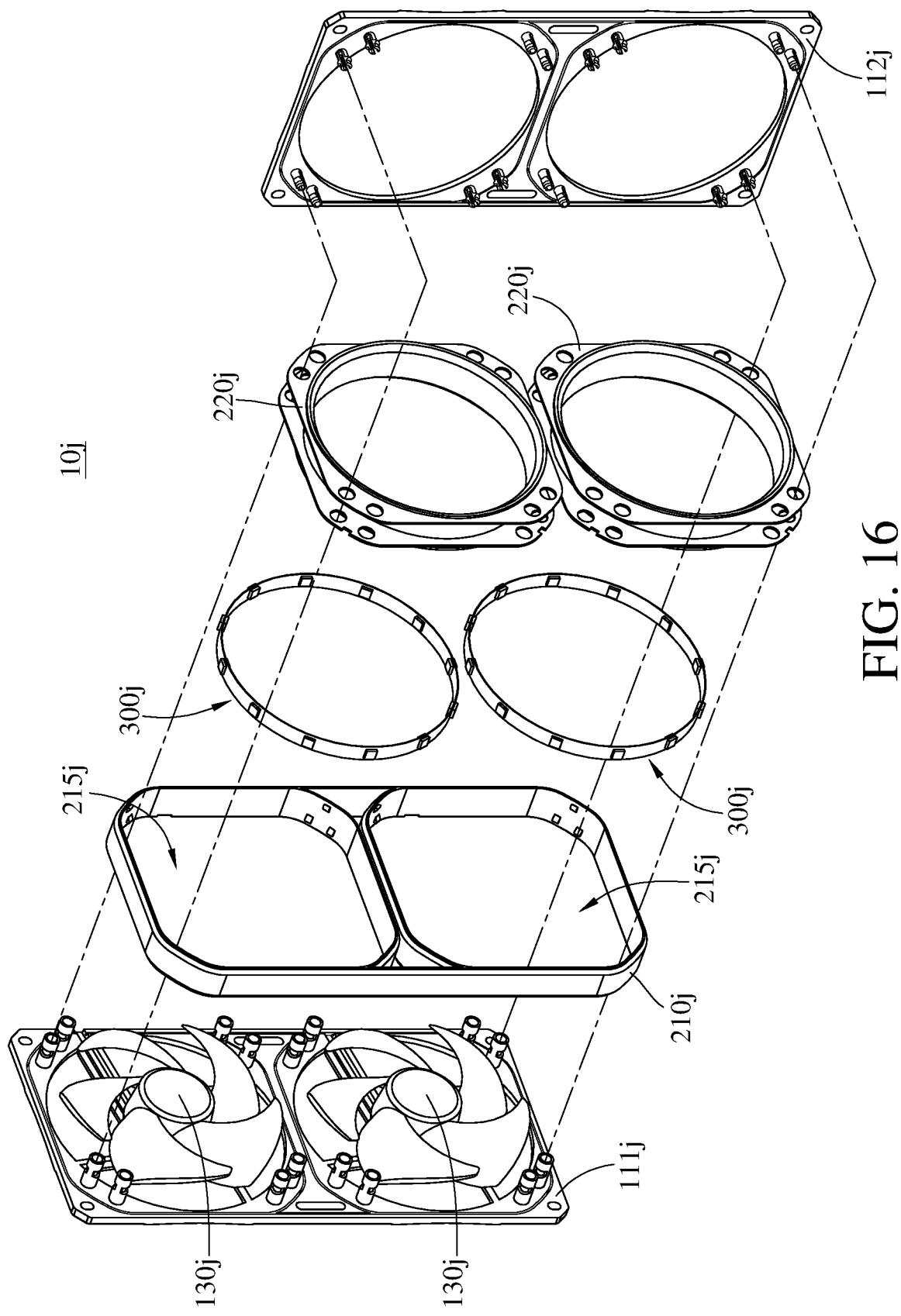
FIG. 16 is an exploded view of the luminous fan in FIG. 15.

Then, please refer to FIGS. 15 and 16, FIG. 15 is a cross-sectional view of a luminous fan according to a tenth embodiment of the disclosure, and FIG. 16 is an exploded view of the luminous fan in FIG. 15.

In this embodiment, a luminous fan 10j includes a first carrier board 111j, two propellers 130j, a second carrier board 112j, an outer light guide ring 210j, two inner light guide rings 220j and two light sources 300j.

The two propellers 130j are both mounted on the first carrier board 111j. The two inner light guide rings 220j are both mounted on the first carrier board 111j and respectively surround the two propellers 130j. The first carrier board 111j, the second carrier board 112j and the inner light guide rings 220j are mounted together. It is noted that the first carrier board 111*j*, the second carrier board 112*j* and the inner light guide rings 220*j* are mounted in the way the same as the previous embodiments, so the repetitive details are omitted for simplicity, and the following paragraphs only illustrate the differences between these embodiments.

The outer light guide ring 210*j* has two through holes 215*j*, such that the outer light guide ring 210*j* is an 8-shaped object. The outer light guide ring 210*j* is mounted on the two inner light guide rings 220*j*, and the two inner light guide rings 220*j* are respectively aligned with and disposed in the two through hole 215*j*. It is noted that the outer light guide ring 210*j* and the inner light guide rings 220*j* are mounted in the way the same as the previous embodiments, so the repetitive details are omitted for simplicity.

Also, the quantity of the propellers 130*j* in the luminous fan 10*j* is not restricted. In some other embodiments, the luminous fan may include more than three propellers, and the propellers may be arranged in a line or an array.

The main purpose of the present disclosure is to create a complete annulus of light (or a ring-shaped illumination) and an annular halo at the exterior of the luminous fan. As can be seen from the above embodiments, there are numerous implementable embodiments that can achieve the main purpose of the present disclosure, thus the inventor only lists a few that are distinctive, but the present disclosure is not limited thereto. Those skilled in the art can combine the technical features mentioned in the present disclosure according to their requirements. For example, the first mounting part and the second mounting part may be made of a material permeable to light to allow the light from the first ring-shaped illuminating surface to pass through; to modify the shape of the main body as long as it does not block the emitting light from the first ring-shaped illuminating surface (that is, the main body is located out of a range of the emitting light from the first ring-shaped illuminating surface).

Figure 17:
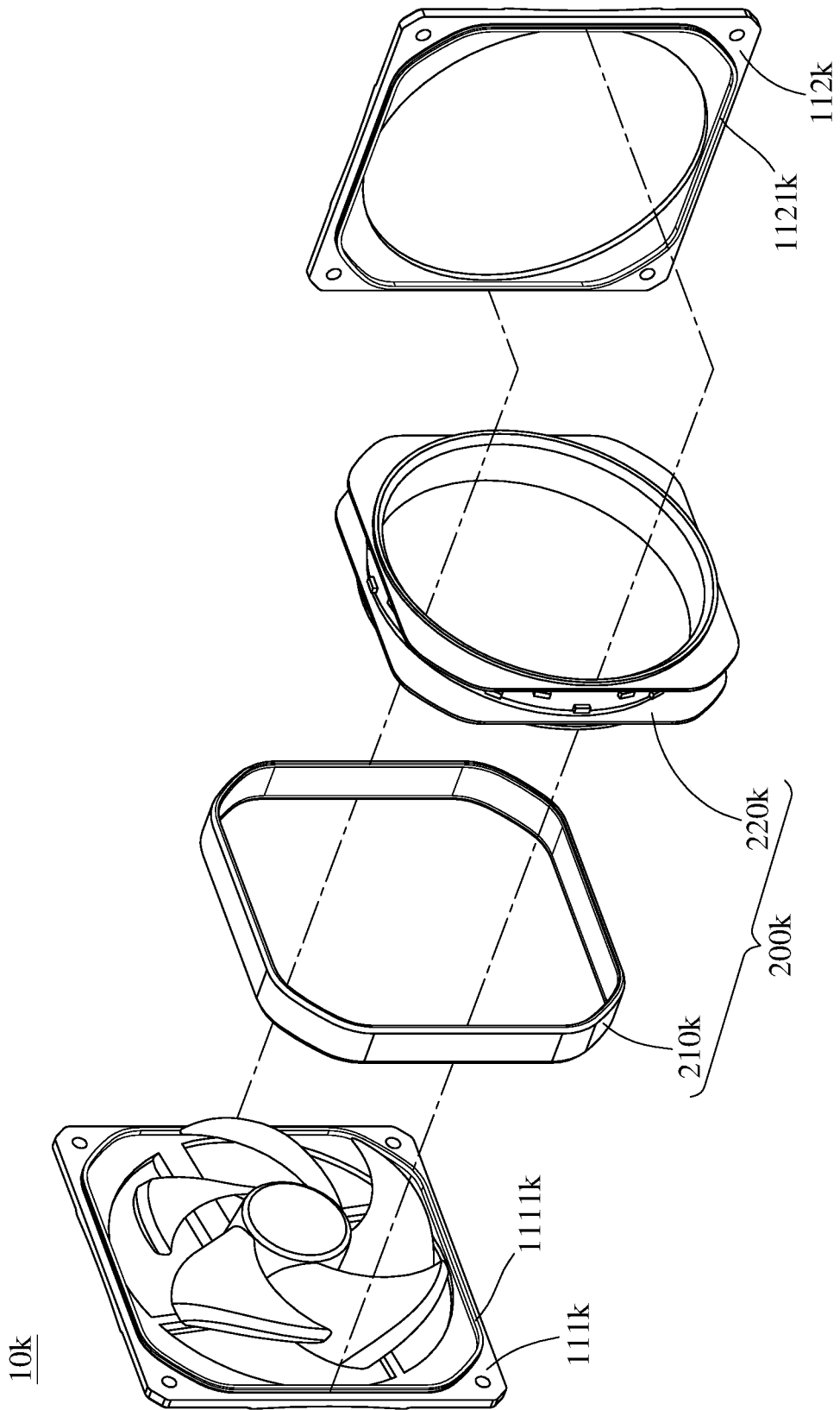
FIG. 17 is an exploded view of a luminous fan according to an eleventh embodiment of the disclosure.
Figure 18:
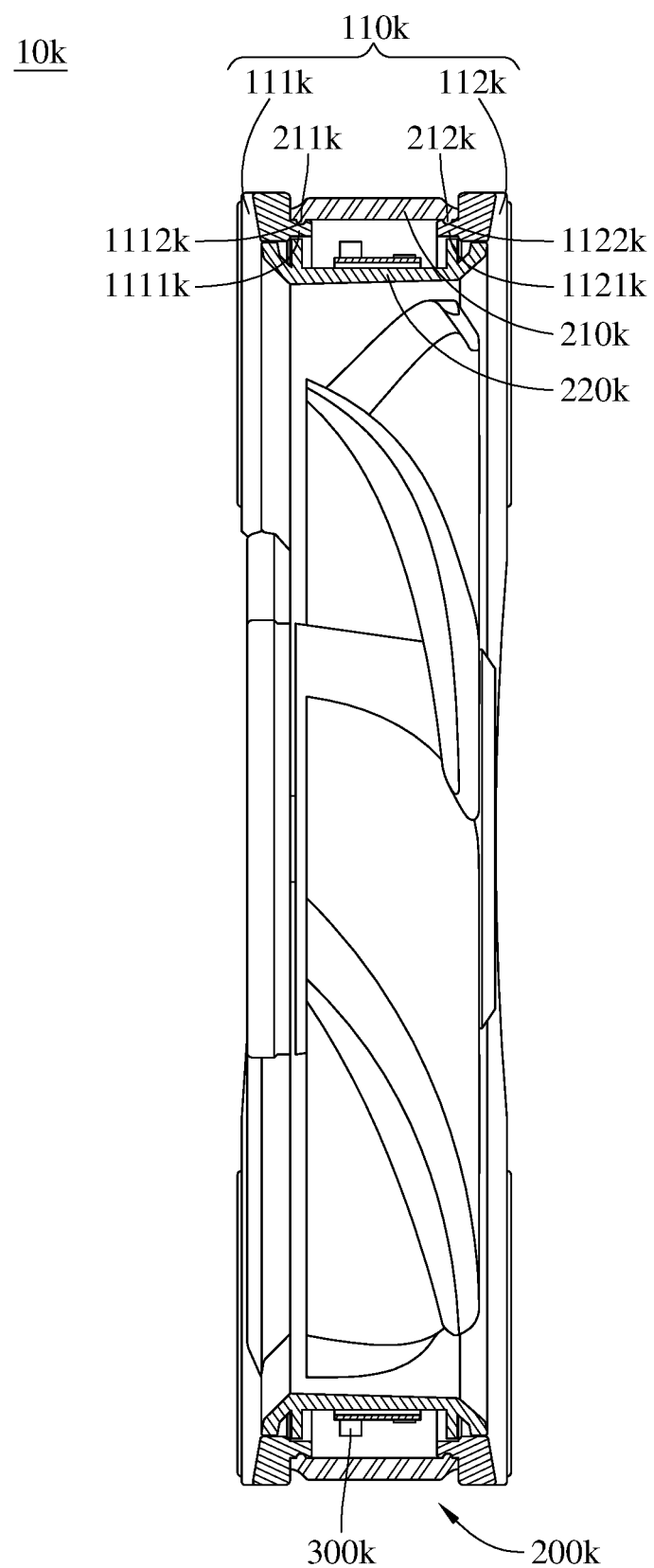
FIG. 18 is a cross-sectional view of the luminous fan in FIG. 17.

Then, please refer to FIGS. 17 and 18, FIG. 17 is an exploded view of a luminous fan according to an eleventh embodiment of the disclosure, and FIG. 18 is a cross-sectional view of the luminous fan in FIG. 17.

In this embodiment, a luminous fan 10*k* includes a fan frame 110*k*, a light guide member 200*k* and a light source 300*k*. The fan frame 110*k* includes a first carrier board 111*k* and a second carrier board 112*k*. The first carrier board 111*k* has a ring-shaped stopper 1111*k* and a first mounting part 1112*k*, and the second carrier board 112*k* has a ring-shaped stopper 1121*k* and a first mounting part 1122*k*. The first mounting part 1112*k* is located on the ring-shaped stopper 1111*k*, and the first mounting part 1122*k* is located on the ring-shaped stopper 1121*k*.

The light guide member 200*k* includes an outer light guide ring 210*k* and an inner light guide ring 220*k*. Two opposite sides of the inner light guide ring 220*k* are respectively in contact with an inner side of the ring-shaped stopper 1111*k* and an inner side of the ring-shaped stopper 1121*k*. The outer light guide ring 210*k* has two second mounting parts 211*k* and 212*k*. The first mounting parts 1112*k* and 1122*k* and the second mounting parts 211*k* and 212*k* are female structures and male structures that match in shape. The second mounting parts 211*k* and 212*k* are respectively disposed on the first mounting parts 1112*k* and 1122*k* in order to position the outer light guide ring 210*k*.

Figure 19:
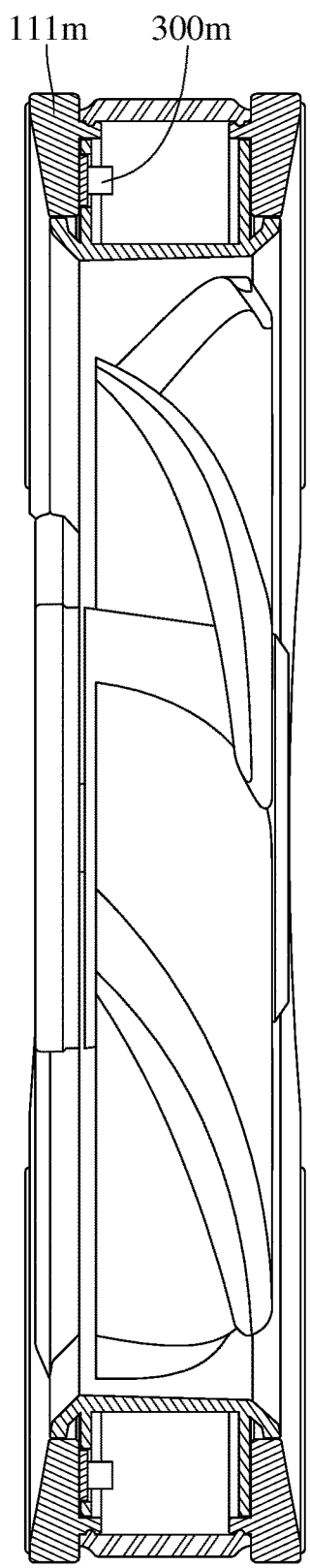
FIG. 19 is a cross-sectional view of a luminous fan according to a twelfth embodiment of the disclosure.

The light source 300*k* is located between the outer light guide ring 210*k* and the inner light guide ring 220*k*, and is stacked on the inner light guide ring 220*k*, but the present disclosure is not limited thereto. Please refer to FIG. 19. FIG. 19 is a cross-sectional view of a luminous fan according to a twelfth embodiment of the disclosure. In this embodiment, a light source 300*m* is mounted on a first carrier board 111*m*. In addition, if there is no requirement of emitting light, then the above fans may not be equipped with the light source.

According to the luminous fan and the light guide member thereof as discussed in above, regardless of whether the outer light guide ring is made of one piece or consisted of a multiple of components, the outer light guide ring surrounds the fan frame and the mounting part of the light guide member (that is, the distance between the first ring-shaped illuminating surface and the rotation axis is larger than the distance between a side of the first mounting part away from the rotation axis and the rotation axis), such that the ring-shaped illuminating surface of the outer light guide ring is not blocked by the mounting part, ensuring to create a complete annulus of light (or a ring-shaped illumination) and an annular halo at the exterior of the luminous fan and thereby improving the visual effect of the luminous fan.

Also, as long as the first ring-shaped illuminating surface is not blocked by the mounting part, the luminous fan still can create the ring-shaped illumination even when the distance between the first ring-shaped illuminating surface and the rotation axis is smaller than the distance between a side of the first mounting part away from the rotation axis and the rotation axis.

In addition, the first ring-shaped illuminating surface, the second ring-shaped illuminating surface and the third ring-shaped illuminating surface may each be a matte surface in order to turn the exiting light into a soft diffuse light.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A luminous fan, comprising:
a main body, comprising a fan frame and a propeller, and the propeller rotatably mounted on the fan frame;
a light guide member, comprising an outer light guide ring and an inner light guide ring, the outer light guide ring and the inner light guide ring mounted on the fan frame, the inner light guide ring having an air channel, the propeller located in the air channel, and the outer light guide ring surrounding the inner light guide ring and whole of the outer light guide ring exposed from the luminous fan; and
at least one light source, disposed between the outer light guide ring and the inner light guide ring,
wherein the fan frame comprises a first carrier board and a second carrier board, the first carrier board and the second carrier board each having a plurality of first mounting parts, the inner light guide ring has a plurality of second mounting parts, the plurality of first mounting parts of the first carrier board and the plurality of first mounting parts of the second carrier board are connected, the plurality of first mounting parts of the first carrier board or the plurality of first mounting parts of the second carrier board are respectively connected to the plurality of second mounting parts, and wherein the outer light guide ring is mounted on the inner light guide ring and surrounds the plurality of first mounting parts and the plurality of second mounting parts.

2. The luminous fan according to claim 1, wherein the plurality of first mounting parts are mounting protrusions, the plurality of second mounting parts are through bores, the plurality of first mounting parts of the first carrier board or the plurality of first mounting parts of the second carrier board are respectively disposed through the plurality of second mounting parts.

3. The luminous fan according to claim 1, further comprising a plurality of fasteners, the plurality of first mounting parts are threaded holes, the plurality of second mounting parts are through bores, the plurality of fasteners are respectively disposed through the plurality of first mounting parts of the first carrier board, the plurality of first mounting parts of the second carrier board and the plurality of second mounting parts so that the plurality of first mounting parts of the first carrier board or the plurality of first mounting parts of the second carrier board are respectively fixed to the plurality of second mounting parts via the plurality of fasteners.

4. The luminous fan according to claim 1, wherein the first carrier board and the second carrier board each have an annular positioning slot, two opposite sides of the inner light guide ring are respectively embedded into the annular positioning slot of the first carrier board and the annular positioning slot of the second carrier board.

5. The luminous fan according to claim 1, wherein the light guide member further comprises a light guide carrier board, the light guide carrier board is mounted on the fan frame, the light guide carrier board has a plurality of mounting protrusions, the inner light guide ring has a plurality of mounting holes, and the plurality of mounting protrusions are respectively disposed through the plurality of mounting holes.

6. The luminous fan according to claim 1, wherein the at least one light source comprises a ring-shaped circuit board and a plurality of light-emitting diodes, the ring-shaped circuit board surrounds the propeller, and the plurality of light-emitting diodes are disposed at a same side of the ring-shaped circuit board.

7. The luminous fan according to claim 1, wherein the at least one light source comprises a ring-shaped circuit board and a plurality of light-emitting diodes, the ring-shaped circuit board surrounds the propeller, and the plurality of light-emitting diodes are disposed at two opposite sides of the ring-shaped circuit board.

8. The luminous fan according to claim 1, wherein the quantity of the at least one light source is plural, each of the light sources comprises a circuit board and a plurality of light-emitting diodes, the plurality of light-emitting diodes are mounted on the circuit board, and the light sources surround the propeller.

9. The luminous fan according to claim 1, wherein the fan frame comprises a first carrier board and a second carrier board, the outer light guide ring and the inner light guide ring are disposed between the first carrier board and the second carrier board, and the at least one light source is mounted on the first carrier board.

10. The luminous fan according to claim 1, wherein the outer light guide ring has at least one first magnetic component, the inner light guide ring has at least one second magnetic component, the at least one first magnetic component of the outer light guide ring attract the at least one second magnetic component of the inner light guide ring so as to mount the outer light guide ring on the inner light guide ring.

11. The luminous fan according to claim 5, wherein the fan frame comprises a first carrier board and a second carrier board, the first carrier board is mounted on a side of the light guide carrier board facing away from the inner light guide ring, the second carrier board has a plurality of mounting protrusions, the plurality of mounting protrusions of the light guide carrier board and the plurality of mounting protrusions of the second carrier board are connected, the plurality of mounting protrusions of the light guide carrier board or the plurality of mounting protrusions of the second carrier board are respectively disposed through the plurality of mounting holes, and the outer light guide ring is mounted on the inner light guide ring and surrounds the plurality of mounting protrusions.

\* \* \* \* \*